US007586381B2

(12) United States Patent
Rohde et al.

(10) Patent No.: US 7,586,381 B2
(45) Date of Patent: Sep. 8, 2009

(54) USER-DEFINABLE, LOW COST, LOW PHASE HIT AND SPECTRALLY PURE TUNABLE OSCILLATOR

(75) Inventors: Ulrich L. Rohde, Upper Saddle River, NJ (US); Ajay Kumar Poddar, Fairlawn, NJ (US); Klaus Juergen Schoepf, Ringwood, NJ (US); Parimal Patel, Jersey City, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 146 days.

(21) Appl. No.: 11/592,011

(22) Filed: Nov. 2, 2006

(65) Prior Publication Data

US 2007/0115073 A1    May 24, 2007

Related U.S. Application Data

(60) Provisional application No. 60/732,787, filed on Nov. 2, 2005, provisional application No. 60/733,501, filed on Nov. 4, 2005.

(51) Int. Cl.
*H03B 5/18* (2006.01)
(52) U.S. Cl. .................. 331/96; 331/36 C; 331/117 R; 331/185
(58) Field of Classification Search ............... 331/36 C, 331/96, 117 R, 185
See application file for complete search history.

(56) References Cited

U.S. PATENT DOCUMENTS

| 2,502,488 | A | | 4/1950 | Shockley |
| 2,524,035 | A | | 10/1950 | Bardeen et al. |
| 3,373,379 | A | * | 3/1968 | Black .................... 331/116 R |
| 4,310,809 | A | | 1/1982 | Buck et al. |
| 4,338,576 | A | | 7/1982 | Takahashi et al. |
| 4,435,688 | A | | 3/1984 | Shinkawa et al. |
| 4,479,259 | A | * | 10/1984 | Fenk ........................ 331/109 |
| 4,527,130 | A | | 7/1985 | Lutteke |
| 4,619,001 | A | | 10/1986 | Kane |
| 4,621,241 | A | | 11/1986 | Kiser |
| 4,633,197 | A | | 12/1986 | Vanderspool, II |

(Continued)

FOREIGN PATENT DOCUMENTS

DE          3443446 A       5/1986

(Continued)

OTHER PUBLICATIONS

D. Ham, A. Hajimiri, "Concepts and Methods in Optimization of Integrated LCVCOs," IEEE Journal of Solid-State Circuits, Jun. 2001.

(Continued)

*Primary Examiner*—Robert Pascal
*Assistant Examiner*—Levi Gannon
(74) *Attorney, Agent, or Firm*—Lerner, David, Littenberg, Krumholz & Mentlik, LLP

(57) ABSTRACT

A tunable oscillator includes a first transistor, a second transistor connected in parallel with the first transistor, a noise feedback and bias network coupled to the first and second transistors, a planar coupled resonator network coupled to the transistors and a means for dynamically tuning the resonant frequency of the planar coupled network and the junction capacitance of the transistors.

32 Claims, 17 Drawing Sheets

U.S. PATENT DOCUMENTS

| | | | |
|---|---|---|---|
| 4,661,785 A * | 4/1987 | Benjaminson | 331/109 |
| 4,677,396 A | 6/1987 | Cruz et al. | |
| 4,692,714 A | 9/1987 | Galani | |
| 4,812,784 A | 3/1989 | Chung et al. | |
| 4,868,526 A | 9/1989 | Camiade | |
| 5,041,799 A | 8/1991 | Pirez | |
| 5,053,649 A | 10/1991 | Johnson | |
| 5,142,255 A | 8/1992 | Chang et al. | |
| 5,187,451 A | 2/1993 | Nakamoto et al. | |
| 5,231,361 A | 7/1993 | Smith et al. | |
| 5,363,067 A | 11/1994 | Crandall et al. | |
| 5,373,264 A | 12/1994 | Higgins, Jr. | |
| 5,402,087 A | 3/1995 | Gorczak | |
| 5,434,542 A | 7/1995 | Veith et al. | |
| 5,650,754 A | 7/1997 | Joshi | |
| 5,661,439 A | 8/1997 | Watkins et al. | |
| 5,748,051 A | 5/1998 | Lewis | |
| 5,821,410 A | 10/1998 | Xiang et al. | |
| 5,854,578 A | 12/1998 | Minasi et al. | |
| 5,900,788 A | 5/1999 | Hagemeyer et al. | |
| 5,936,480 A * | 8/1999 | Chong | 331/117 R |
| 6,124,767 A | 9/2000 | Woods | |
| 6,297,708 B1 | 10/2001 | Lemay | |
| 6,326,854 B1 | 12/2001 | Nicholls et al. | |
| 6,486,744 B1 | 11/2002 | Cann | |
| 6,489,853 B1 | 12/2002 | Lewis | |
| 6,501,341 B2 | 12/2002 | Mashimo | |
| 6,624,726 B2 | 9/2003 | Niu | |
| 6,630,869 B2 | 10/2003 | Flynn et al. | |
| 6,714,088 B2 | 3/2004 | Chang | |
| 6,714,772 B2 | 3/2004 | Kasahara et al. | |
| 6,731,181 B2 | 5/2004 | Fukayama et al. | |
| 6,734,745 B2 | 5/2004 | Sakai | |
| 6,737,928 B2 | 5/2004 | Kubo et al. | |
| 7,061,333 B2 * | 6/2006 | Aikawa et al. | 331/56 |
| 7,102,453 B1 * | 9/2006 | Rohde et al. | 331/117 R |
| 2001/0004225 A1 | 6/2001 | Nicholls et al. | |
| 2001/0030583 A1 | 10/2001 | Ikarashi | |
| 2001/0035794 A1 | 11/2001 | Fujidai et al. | |
| 2002/0084860 A1 | 7/2002 | Festag et al. | |
| 2003/0160660 A1 | 8/2003 | Chang et al. | |
| 2004/0095197 A1 | 5/2004 | Wang et al. | |
| 2004/0130402 A1 | 7/2004 | Marquardt | |
| 2005/0156683 A1 | 7/2005 | Rohde et al. | |
| 2005/0242896 A1 | 11/2005 | Rohde et al. | |
| 2005/0280478 A1 | 12/2005 | Patel et al. | |

FOREIGN PATENT DOCUMENTS

| | | |
|---|---|---|
| EP | 0 475 262 A | 3/1992 |
| EP | 0 800 224 A | 10/1997 |
| EP | 0 823 777 | 2/1998 |
| EP | 0 843 374 A | 5/1998 |
| EP | 1 093 216 A | 4/2001 |
| EP | 1-542-353 | 6/2005 |
| EP | 1-589 655 | 10/2005 |
| JP | 59-072205 A | 4/1984 |
| JP | 59-139708 A | 8/1984 |
| WO | WO-02/17476 A | 2/2002 |
| WO | WO-02/05416 A1 | 11/2002 |
| WO | WO-2005/015731 | 2/2005 |

OTHER PUBLICATIONS

U.L. Rohde, A Novel RFIC for UHF Oscillators (Invited), 2000 IEEE Radio Frequency Integrated Circuits (RFIC) Symposium, Boston, MA, Jun. 11-13, 2000.

E. Hegazi, H. Sjoland, and A. Abidi, "A Filtering Technique to Lower LC Oscillator Phase Noise," IEEE J. Solid-State Circuits, vol. 36, pp. 1921-1929, Dec. 2001.

J. C. Nallatamby, M. Prigent, M. Camide, J. Obregon, "Phase Noise in Oscillators-Leeson Formula Revisited," IEEE Transactions on Microwave Theory and Techniques, vol. 51, No. 4, pp. 1386-1394, Apr. 2003.

M. Vidmar, "A Wideband, Varactor-Tuned Microstrip VCO," Microwave Journal, Jun. 1999.

H.C. Chang, "Phase noise self-injection-locked oscillators- Theory and experiment," IEEE Transactions on Microwave Theory and Techniques, vol. 51, No. 9, pp. 1994-1999, Sep. 2003.

Franz X. Sinnesbichler, "Hybrid Millimeter-Wave Push-Push Oscillators using Silicon-Germanium HBTs," IEEE MTT-S, vol. 51, Feb. 2003.

U.L. Rohde, D.P. Newkirk, RF/Microwave Circuit Design for Wireless Applications, pp. (123-197), John Wiley & Sons, Apr. 2000, ISBN 0-471-29818-2.

Douglas R. Jachowski, "Passive Enhancement of Resonator Q in Microwave Notch Filters", IEEE MTT-S Digest, pp. 1315-1318, Jun. 2004.

A. K. Poddar, S.K. Koul, and B. Bhat, "Millimeter Wave Evanescent Mode Gunn Diode Oscillator in Suspended Stripline Configuration." 22nd international Conference on Millimeter Waves, pp. 265-266, Jul. 1997.

Henkes, Dale D, 'Designing Short High Q Resonators', Design, Dec. 2003, pp. 75-109.

Ulrich Rohde, "A New and Efficient Method of Designing Low Noise Microwave Oscillators," PhD Dissertation, Technical University of Berlin, 2004.

Wing Shing Chan et al: "The Design of Oscillators using the Cascode Circuit" Circuits and Systems, 1994, vol. 5, pp. 689-692, May 30, 1994.

Franz X. Sinnesbichier, "Hybrid Millimeter-Wave Push-Push Oscillators Using Silicon-Germanium HBTs," IEEE MTT-S, vol. 51, Feb. 2003.

S. Kudszus, W. H. Haydi, A. Tessman, W. Bronner, and M. Schlechtweg, "PushPush Oscillators for 94 and 140 GHz Applications Using Standard Pseudomorphic GaAs HEMTs," IEEE MTT-S, Microwave Symp. Digest, 2001, pp. 1571-1574.

Y. Baeyens et al., "Compact InP-based HBT VCOs with a Wide Tuning Range at W- and D-Band," IEEE Trans. MTT, vol. 48, pp. 2403-2408, Dec. 2000.

Y. Sun, T. Tieman, H. Pflung, and W. Velthius, "A Fully Integrated Dual-Frequency Push-Push VCO for 5.2 and 5.8GHz Wireless Applications," Microwave Journal., pp. 64-74, Apr. 2001.

M. Schott, H. Kuhnert, J. Hilsenbeck, J. Wurfl, and H. Heinrich, "38 GHz Push-Push GaAs-HBT MMIC Oscillator," IEEE MTT-S, Digest, 2002, pp. 839-842.

F. X. Sinnesbichler and O. R. Olbrich, "SiGe HBT Push-Push Oscillators for V-Band Operation," IEEE MTT-S silicon Monolithic Integrated Circuits in RF Systems Symp., Garmisch, Germany, Apr. 26-28, 2000, pp. 55-59.

F. X. Sinnesbichler, H. Geltinger, and G. R. Olbrich, "A 38 GHz Push-Push Oscillator Based on 25 GHz-fT BJTs," IEEE Microwave Guided Wave Lett. vol. 9 pp. 151-153, Apr. 1999.

K. W. Kobayashi et al., "A 108-0Hz InP-based HBT Monolithic Push-Push VCO with Low Phase Noise and Wide Tuning Bandwidth," IEEE J. Solid-State Circuits, vol .34, pp. 1225-1232, Sep. 1999.

L. Dussopt, D. Guillois, and G. Rebeiz, "A Low Phase Noise Silicon 9 GHz VCO and an 18 GHz Push-Push Oscillator," IEEE MTT-S, Digest, 2002, pp. 695-698.

F. X. Sinnesbichier, B. Hauntz and G. R. Olbrich, "A Si/SiGe HBT Dielectric Resonator Push-Push Oscillators at 58 GHz," IEEE Microwave Guided Wave Lett. vol. 10, pp. 145-147, Apr. 2000.

Mortazawi A and B. C. De Loach, Jr., "Multiple Element Oscillators Utilizing a New Power Combining Technique," in IEEE MTT-S Tnt. Microwave Symp. Dig., 1992, pp. 1093-1096.

B. Van der Pol, "The Nonlinear Theory of Electrical Oscillations," Proc. IRE, vol. 22 No. 9, pp. 1051-1086, Sep. 1934.

R. Adler, "A Study of Locking Phenomena in Oscillators," Proc. IEEE, vol. 61, pp. 180-1385, Oct. 1973.

D. B. Leeson, A Simple Model of Feedback Oscillator Noise Spectrum, Proc. IEEE, pp. 329-332, 1966.

M. Odyniec, Editor, RF and Microwave Oscillator Design, Chapter 3: Linearity, Time Variation, and Oscillator Phase Noise, by T. Lee and A. Hajimiri, Artech House, 2002.

Heng-Chia Chang, Xudong Cao, Umesh K. Mishra, and R. York, "Phase Noise in Coupled Oscillators: Theory and Experiment," IEEE Trans. MTT, vol. 45, pp. 604-615, May 1997.

Heng-Chia Chang, Xudong Cao, Mark J. Vaughan, Umesh K. Mishra, and R. York, "Phase Noise in Externally Injection-Locked Oscillator Arrays," IEEE Trans. MTT, vol. 45, pp. 2035-2042, Nov. 1997.

Andrea Borgioli, Pochi Yeh, and Robert A. York, "Analysis of Oscillators with External Feedback Loop for Improved Locking Range and Noise Reduction," IEEE Trans. MTT, vol. 47, pp. 1535-1543, Aug. 1999.

Jonathan J. Lynch and Robert A. York, "Synchronization of Oscillators Coupled through Narrow-Band Networks," IEEE Trans. MTT, pp. 238-249, Feb. 2001.

Klaus F. Schunemann and Karl Behm, "Nonlinear Noise Theory for Synchronized Oscillators," IEEE Trans. MTT, vol. 27, pp. 452-458, May 1979.

Kaneyuki Kurokawa, "The Single Cavity Multiple Device Oscillator," IEEE Trans. MTT, vol. 19, pp. 793-801, Oct. 1971.

Kaneyuki Kurokawa, "Noise in Synchronized Oscillators," IEEE Trans. MTT, vol. 16, pp. 234-240, Apr. 1968.

Byeong-Ha Park, "A Low-Voltage, Low-Power, CMOS 900 MHz Frequency Synthesizer," Ph.D. Dissertation, Georgia Institute of Technology, Dec. 1997.

W. O. Schlosser, "Noise in Mutually Synchronized Oscillators," IEEE Trans. Microwave Theory Tech., vol. MTT-16, pp. 732-737, Sep. 1968.

Heng-Chia Chang, "Analysis of Coupled Phase-Locked Loops With Independent Oscillators for Beam Control Active Phased Arrays," IEEE Trans. MTT, vol. 52, pp. 1059-1065, Mar. 2004.

Reidar L. Kuvas, "Noise in Single-Frequency Oscillators and Amplifiers," IEEE Trans. Microwave Theory Tech., vol. MTT-21, pp. 127-134, Mar. 1973.

H. Stark, and J. W. Woods, Probability, Random Processes, and Estimation Theory for Engineers. New York: Prentice-Hall, 1986.

R. A. York, P. Liao, and J. J. Lynch, "Oscillator Array Dynamics with Broadband N-Port Coupling Networks," IEEE Trans. Microwave Theory Tech., vol. 42, pp. 2040-2045, Nov. 1994.

R. A. York, "Nonlinear Analysis of Phase Relationships in Quasi-Optical Oscillator Arrays," IEEE Trans. Microwave Theory Tech., vol. 41, pp. 1799-1809, Oct. 1993.

Shih-Chieh Yen and Tah-Hsiung Chu, "An Nth-Harmonic Oscillator Using an N-push Coupled Oscillator Array with Voltage-clamping Circuits", IEEE, MTT-S Digest, pp. 2169-2172, 2003.

J. R. Bender, C. Wong, "Push-Push Design Extends Bipolar Frequency Range," Microwave & RF, pp. 91-98, Oct. 1983.

Franco Ramirez, Jose Lius Garcia H., Tomas Fernandez and Almudena Suarez, "Nonlinear Simulation Techniques for the Optimized Design of Push-Push Oscillators", IEEE, MTT-S Digest, pp. 2157-2160, 2003.

Jeong-Geum Kim, Dong-Hyun Baek, Sang-Hoon Jeon, Jae-Woo Park and Songcheol Hong, A 60 GHz InGaP/GaAs HBT Push-Push MMIC VCO, IEEE, MTT-S Digest, pp. 885-888, 2003.

F. X. Sinnesbichler, B. Hautz, G. R. Olbrich, "Low Phase Noise 58 GHz SiGe HBT Push-Push Oscillator with Simultaneous 29 GHz Output", IEEE, MTT-S Digest, pp. 35-38, 2000.

Hai Xiao, Takayuki Tanka and Masayoshi Aikawa, "A Ka-Band Quadruple-Push Oscillator", IEEE, MTT-S Digest, pp. 889-892, 2003.

R. G. Freitag, S.H. Lee, D.M. Krafcsik, D.E. Dawson and J. E. Degenford, "Stability and Improved Circuit Modeling Considerations for High Power MMIC Amplifiers", IEEE, MM-Wave Monolithic Circuits Symposium, pp. 125-128, 1988.

J. Heinbockel and A. Mortazawi, "A Periodic Spatial Power Combining MESFET Oscillator", IEEE, MTT-S Digest, pp. 545-548, 1992.

M. Kuramitsu and F. Takasi, "Analytical Method for Multimode Oscillators Using the Averaged Potential," Elec. Communication Japan, vol. 66-A, pp. 10-19, 1983.

Ronald G. Freitag, "A Unified Analysis of MMIC Power Amplifier Stability," IEEE, MTT-S Digest, pp. 297-300, 1992.

Shigeji Nogi, Jenshan Lin and Tatsuo Itoh., "Mode Analysis and Stabilization of a Spatial Power Combining Array with Strongly Coupled Oscillators", IEEE, MTT, vol. 41, pp. 1827-1837, Oct. 1993.

Amir Mortazawi, Heinrich D. Foltz, and Tatsuo Itoh, "A Periodic Second Harmonic Spatial Power Combining Oscillator", IEEE, MTT, vol. 40, pp. 851-856, May 1992.

Jonathan J. Lynch and Robert A. York, "An Analysis of Mode-Locked Arrays of Automatic Level Control Oscillators," IEEE Trans. on Circuits and Systems-I, vol. 41, pp. 859-865, Dec. 1994.

R. A. York and R.C. Compton, "Mode-Locked Oscillator Arrays", IEEE Microwave and Guided Wave Letter, vol. 1, pp. 215-218, Aug. 1991.

Yu-Lung Tang and Huei Wang, "Triple-Push Oscillator Approach: Theory and Experiments," IEEE- JSS, vol. 36, pp. 1472-1479, Oct. 2001.

J. Everard, Fundamentals of RF Circuit Design with Low Noise Oscillators, John Wiley & Sons. Ltd, 2001.

U.L. Rohde, "Improved Noise Modeling of GaAs FETS: Using an Enhanced Equivalent Circuit Technique," Microwave Journal, pp. 87-101—Nov. 1991.

R.A. Pucel, W. Struble, R. Hallgren, U.L. Rohde, "A General Noise De-embedding Procedure for Package Two-Port Linear Active Devices," IEEE Transactions on MTT, vol. 40, No. 11, pp. 2013-2024, Nov. 1992.

U.L. Rohde, "Parameter Extraction for Large Signal Noise Models and Simulation of Noise in Large Signal Circuits Like Mixers and Oscillators," 23rd European Microwave Conference, Madrid, Spain, Sep. 6-9, 1993.

C. Arnaud, D. Barataud, J. Nebus, J. Teyssier, J. Villotte, D. Floriot, "An Active Pulsed RF and Pulsed DC Load-Pull System for the Characterization of HBT Power Amplifiers Used in Coherent Radar and Communication Systems," IEEE Transactions on MTT, vol. 48, No. 12, pp. 2625-2629, Dec. 2000.

F.M. Ghannouchi, R. Larose, R.G. Bosisio, "A New Multiharmonic Loading Method for Large-Signal Microwave and Millimeter-Wave Transistor Characterization," IEEE Transactions on MTT, vol. 39, No. 6, pp. 986-992, Jun. 1991.

H. Abe, Y. Aono, 11 GHz GaAs Power MESFET Load-Pull Measurements Utilizing a New Method of Determining Tuner Y-Parameters, IEEE Transactions on Microwave Theory and Techniques, vol. 27, No. 5, pp. 394-399, May 1979.

Q. Cai, J. Gerber, S. Peng, "A Systematic Scheme for Power Amplifier Design Using a Multi-Harmonic Load Pull Simulation Technique," 1998 IEEE MTT-S Symposium Digest, vol. 1, pp. 161-165, Jun. 7-12, 1998.

P. Berini, M. Desgagne, F.M. Ghannouchi, R.G. Bosisio, "An Experimental Study of the Effects of Harmonic Loading on Microwave MESFET Oscillators and Amplifiers," IEEE Transactions on MTT, vol. 42, No. 6, pp. 943-950, Jun. 1994.

A. M. Elsayed and M. I. Elmasry, "Low-Phase-Noise LC Quadrature VCO Using Coupled Tank Resonators in a Ring Structure," IEEE, JSSC, vol. 36, pp. 701-705, Apr. 2001.

M. Tiebout, "Low Power, Low-Phase-Noise, Differentially Tuned Quadrature VCO Design in Standard CMOS," IEEE- JSSS, vol. 36, pp. 1018-1024, Jul. 2001.

K.O, "Estimation Methods for Quality Factors of Inductors Fabricated in Silicon Integrated Circuit Process Technologies," IEEE, Journal of Solid-State Circuits, pp. 1249-1252, Aug. 1998.

A.V. Grebennikov, "Microwave Transistor Oscillators: an Analytic Approach to Simplify Computer-Aided Design", Microwave Journal, pp. 292-300, May 1999.

Andrew V. Grebennikov, "Microwave FET Oscillators: an Analytic Approach to Simplify Computer-Aided Design", Microwave Journal, pp. 100-110, Jan. 2000.

Jwo-Shiun Sun, "Design and Analysis of Microwave Varactor-Tuned Oscillators", Microwave Journal, pp. 302-310, May 1999.

M. Regis, G. Llopis, and J. Graffeuil, "Nonlinear Modeling and Design of Bipolar Transistors Ultra-Low Phase-Noise Dielectric-Resonator Oscillators", IEEE transactions on MTT, vol. 46, No. 10, pp. 1589-1593, Oct. 1998.

R. J. Hawkins, "Limitations of Nielsen's and Related Noise Equations Applied to Microwave Bipolar Transistors, and a New Expression for the Frequency and Current Dependent Noise Figure," Solid-State Electron., vol. 20 pp. 191-196, 1977.

T. H. Hsu and C.P. Snapp, "Low-Noise Microwave Bipolar Transistor with Sub-Half-Micrometer Emitter Width," IEEE Trans. Electron Devices, vol. ED-25, pp. 723-730, Jun. 1978.

U. L. Rohde, K. Juergen Schoepf, A.K. Poddar, "Low-Noise VCOs Conquer Wide Bands," Microwaves & RF, pp. 98-106, Jun. 2004.

U. L. Rohde and A. K. Poddar, "Noise Analysis of Systems of Coupled Oscillators", (INMMIC) workshop, Italy, Nov. 15-16, 2004.

A. K. Poddar and K. N. Pandey, "Microwave Switch Using MEMS-Technology," 8th IEEE International Symposium, EDMO-2000, pp. 134-139, Nov. 2000, UK.

A. Ward and B. Ward, "A Comparison of Various Bipolar Transistor Biasing Circuits," Applied Microwave & Wireless, vol. 13, pp. 30-52, 2001.

U. L. Rohde and A. K. Poddar, "Ultra Low Noise Low Cost Multi Octave Band VCO", IEEE Sarnoff Symposium, Princeton, NJ, USA, Apr. 2005.

U. L. Rohde, A. K. Poddar, Juergen Schoepf, Reimund Rebel, and Parimal Patel, "Low Noise Low Cost Ultra Wideband N-Push VCO," IEEE, IMS Symposium, MTT2005, USA.

U. L. Rohde, A. K. Poddar, and Juergen Schoepf, "A Unifying Theory and Characterization of Microwave Oscillator/VCO," 18th IEEE CCECEO5, May 2005, Canada.

U. L. Rohde and A. K. Poddar, "Configurable Ultra Low Ultra Wideband Power Efficient VCOs", 11th European Wireless, Apr. 2005.

U. L. Rohde, A. K. Poddar, and Reimund Rebel, "Ultra Low Noise Low Cost Octave-Band Hybrid-Tuned VCO," 18th IEEE CCECEOS, May 2005, Canada.

A.K. Poddar, A Novel Approach for Designing Integrated Ultra Low Noise Microwave Wideband Voltage-Controlled Oscillators, Dec. 14, 2004.

* cited by examiner

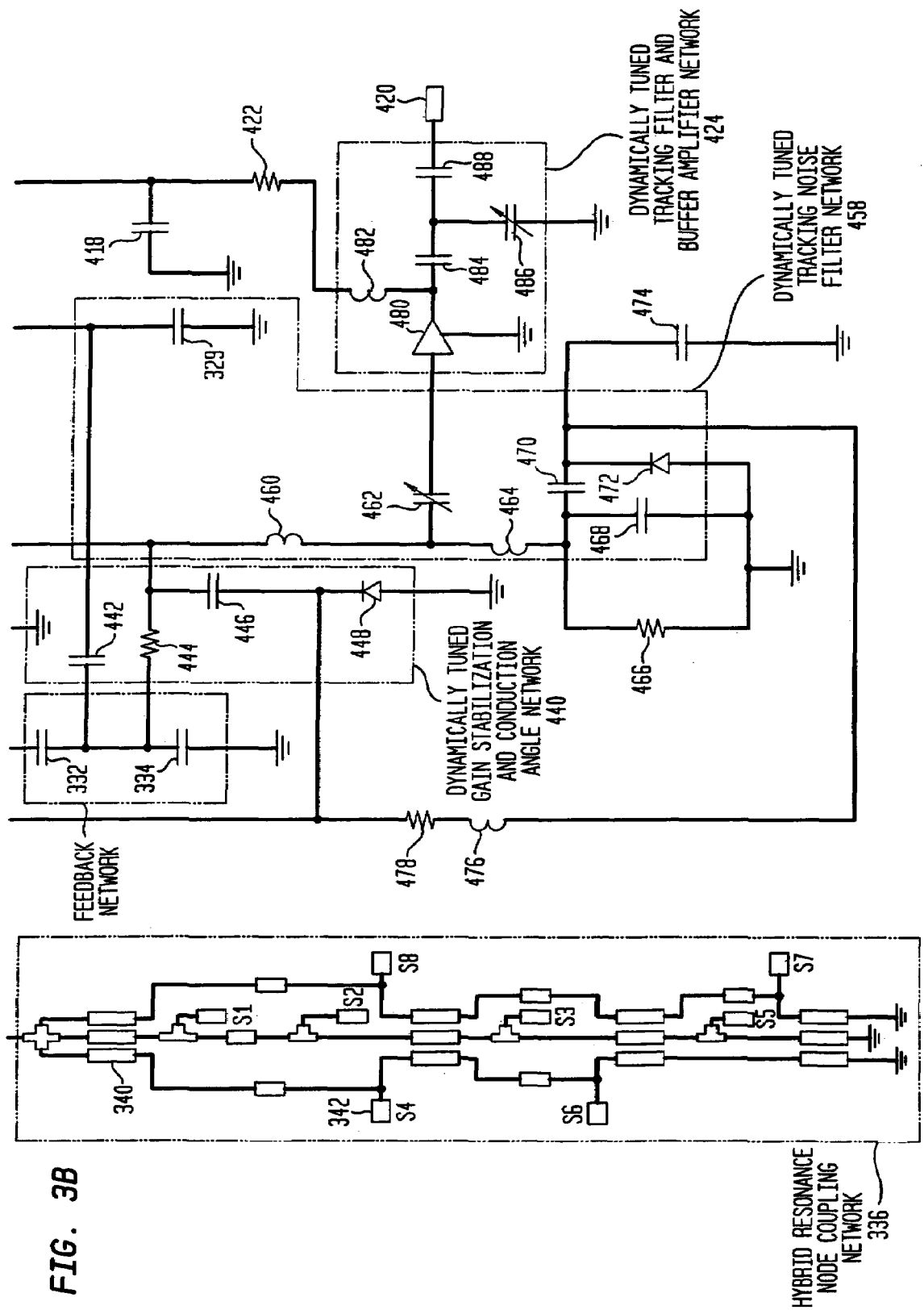

USER-DEFINABLE, LOW COST, LOW PHASE HIT AND SPECTRALLY PURE TUNABLE OSCILLATOR

CROSS-REFERENCE TO RELATED APPLICATIONS

This application claims the benefit of the filing date of U.S. Provisional Patent Application No. 60/732,787, filed Nov. 2, 2005 and U.S. Provisional Patent Application No. 60/733, 501, filed Nov. 4, 2005, the disclosures of which are hereby incorporated herein by reference.

TECHNICAL FIELD

The present disclosure relates to an oscillator and, more particularly, to an oscillator circuit with dynamic tuning capabilities.

BACKGROUND

A voltage controlled oscillator (VCO) is a component that can be used to translate DC voltage into a radio frequency (RF) voltage. The magnitude of the output signal is dependent on the design of the VCO circuit and the frequency of operation is determined by a resonator that provides an input signal. Clock generation and clock recovery circuits typically use VCOs within a phase locked loop (PLL) to either generate a clock signal from an external reference or from an incoming data stream. VCOs are therefore often critical to the performance of PLLs. In turn, PLLs are typically essential components in communication networking as the generated clock signal is typically used to either transmit or recover the underlying information so that the information can be used for its intended purpose. PLLs are particularly important in wireless networks as they enable the communications equipment to quickly lock onto the carrier frequency onto which communications are transmitted.

FIG. 1 illustrates a simplified diagram of a voltage controlled oscillator 100 ("VCO"). The illustrated VCO 100 includes a transistor 102 and two feedback capacitors 104 (connected across the transistor's base and emitter) and 106 (connected between the transistor's emitter and ground), respectively. A resonator 108 is coupled to the base terminal of the transistor 102 through capacitor 110. A tuning network 112 is coupled to the resonator 108 through capacitor 114 and is coupled to the base terminal of the transistor 102 through capacitor 114 and capacitor 110. The emitter terminal of the transistor 102 is grounded through inductor 116 and resistor 118. The collector terminal of the transistor 102 is biased through inductor 120 and resistor 122 by DC voltage supply 124 ("Vcc"). The collector terminal of the transistor 102 is connected to the base terminal of the transistor 102 through inductor 120 and resistor 126. The base terminal of the transistor 102 is connected to ground through resistor 128. An output terminal 142 is coupled to the collector of the transistor through capacitor 144.

The illustrated tuning network 112 includes a capacitor 130, a tuning voltage source 132, a varactor 134, a pair of inductors 136, 138 and a diode 140 connected as indicated. The tuning network 112 is adapted to provide a voltage variable reactance that tunes oscillation to a desired frequency.

Non-linear, time varying (NLTV) frequency modulation may be generated due to changes in the transconductance and junction capacitance ($C_{bc}$, $C_{be}$, and $C_{ce}$) of the transistor 102 over the tuning range and due to variations in the bias point, operating temperature, operating frequency, oscillator conduction angle, and drive level. By selecting an appropriate transistor 102 and optimizing the values of feedback capacitors (104 and 106), phase noise might be reduced. However, such a reduction in phase noise is generally limited to a single fixed frequency and that frequency is generally not user-definable. Furthermore, the illustrated circuit is not user-definable for different operating frequencies (different resonator length is needed for corresponding resonance frequency).

In addition, junction (active device) modulation can create mixing products at new frequencies, which results in phase noise in the oscillator's spectrum. Moreover, the junction capacitance of the transistor (bipolar/FETs) typically changes in a non-linear manner. More particularly, the base-to-collector capacitance of the transistor (bipolar) can vary depending on the voltage across the base-to-collector junction, and is typically independent of the current flowing through the device. Thus, the collector-base junctions in the VCO are at different values of capacitance during an RF oscillation cycle.

A phase hit can be defined as a random, sudden, uncontrolled change in the phase of the signal source that typically lasts for fractions of a second. It can be caused by temperature changes from dissimilar metals expanding and contracting at different rates, as well as from vibration or impact. Microphonics, which are acoustic vibrations that traverse an oscillator package and circuits, can cause a change in phase and frequency. Microphonics are usually dealt with using a hybrid resonance mode in a distributed (micro/strip-line, stripline, suspended stripline) medium.

Phase hits are typically infrequent. But they can cause signal degradation in high-performance communication systems. The effect of phase hits generally increases with data rate. If a phase hit cannot be absorbed by a device (e.g., a receiver) in a communication system, a link may fail resulting in a data loss. As a result, a continuing task is reducing or eliminating phase hits. While phase hits have plagued communication equipment for years, today's higher transmission speeds tend to accentuate the problem given the greater amount of data that may be lost as a result of a phase hit.

The resonator 108 may include LC resonators, ceramic, cavity resonators, dielectric resonators, sapphire-loaded cavity (SLC) resonators, bulk acoustic wave (BAW) resonators, optoelectronic (OE) resonators, yttrium iron garnet (YIG) resonators, Radio Frequency-Micro Electro Mechanical System (RF-MEMS) and planar resonators.

LC resonators are typically formed with a plurality of inductors and capacitors and have a low Q factor. A perfectly lossless resonant circuit generally operates as an oscillator, but truly lossless elements are difficult to realize. The performance of VCOs comprising integrated LC (inductor/capacitor) resonators generally suffer owing to the low quality-factor (Q) of the inductor used in the LC resonator tank. The LC resonator tank includes inductors and capacitors arranged to oscillate by exchanging current or voltage between inductors and capacitors with a finite frequency. Since loss resistance in the inductors and capacitors tends to dissipate energy in the oscillator, the LC resonator loses energy and eventually stops oscillating. Compensating for energy loss implied by the finite Q of the practical LC resonators with the energy supplying action of the active device (three terminal bipolar or FETs) in a finite time is one potentially attractive way to build a practical oscillator. However, even though the loss resistance may be compensated for in this manner by the active devices, the inherent loss resistance and noise associated with the active device (thermal, flicker, shot noise) still degrades the oscillation quality by introducing random jitter and noise, thereby, affects oscillation purity (oscillation amplitude and phase noise).

Additionally, the resonating structure changes and adjusts its response to correct and reduce the frequency variations when the frequency in the feedback loop varies. As the change in the resonator output response on a frequency variation becomes larger, the correction is also typically larger. The change in resonance frequency is a function of the Q value. A higher Q value indicates that the resonator is more insensitive to frequency variations and therefore the oscillator output frequency will be more stable. In order to provide oscillators with high spectral purity and stable outputs, the resonator should desirably have a high Q value as is required for a low noise oscillator. With respect to the LC resonator tank circuit, the quality factor is defined as the ratio of the energy stored in the LC resonator tank to the energy dissipated in the equivalent loss resistor per oscillation cycle. Thus, it is desirable that inductors in an LC tank oscillator have minimum resistance. Unfortunately, on-chip inductors generally have a high loss resistance due to the substrate resistance and resistance of the metal used. Thus, on-chip inductors typically have relatively low Q factors at microwave frequencies. Therefore, the phase noise performance of oscillators using on-chip inductors is generally poor and typically not suitable for modern wireless devices such as cellular phones or satellite communication equipment.

For example, a conventional microstripline resonator is typically etched on the circuit substrate, and is a metal cover is then applied over the circuit board. The capacitance between the planar microstripline section and the cover typically causes cover frequency shift effects. More specifically, the oscillator frequency is frequency modulated by microscopic movements of the cover caused by noise and vibration, thereby; creating microphonics effects that cause phase hits and appear as phase noise performance of the oscillators.

Cavity resonators typically are formed from conductive materials having a variety of possible shapes, including rectangles, cylinders, spheres, etc. Although cavity resonators can have high Q factors and low power requirements, they are typically impractical due to their large size.

Dielectric resonators typically are made of $BaTi_4O_9$ and $Z_rSnTiO_4$. These resonators typically resonate in various modes and exhibit high Q factors. However, dielectric resonators are typically costly and not very useful for applications requiring frequencies below 2 GHz. Sapphire-loaded cavity resonators (SLC) typically have high Q factors but can be costly.

Bulk acoustic wave (BAW) resonators are typically three-layer structures (e.g., top and bottom electrode layers of molybdenum sandwiching a middle layer of oriented piezoelectric aluminum nitride). BAW resonators typically have reasonably good Q factors. However, they are typically very sensitive to temperature and, therefore, usually require thermal stabilization in commercial applications.

Optoelectronic (OE) resonators use optic resonator systems that typically provide a high Q factor. However, the application of OE resonators is typically limited due to gaps in frequency coverage as well as relatively high spurs.

YIG resonators are made of yttrium iron garnet ($Y_3Fe_5O_{11}$) and typically exhibit high Q factors. However, YIG resonators are typically limited to a narrow band of operating frequencies. Planar resonators (e.g., ring, hairpin, microstrip-spiral, coupled line resonators, etc.) can be implemented in integrated circuit fabrication processes, but are typically very large and have low Q factors.

RF-MEMS VCO technology is on the verge of revolutionizing wireless communication systems. RF-MEMS based VCO components such as inductors, variable capacitors, and resonators generally provide superior performance in terms of quality factor, noise, linearity, power consumption, size, and cost. Such performance generally cannot be achieved by conventional approaches. Thus, this makes the RF-MEMS VCO a prime candidate for wireless connectivity. However, MEMS devices, unlike ICs, contain fragile moving parts that must be properly packaged to meet specific requirements. These requirements include protection against handling, shielding against electromagnetic fields, near hermetic cavity seals, low temperature process, good heat-exchange, minimal thermal stress, and RF electrical feed through.

Ceramic and SAW (surface acoustic wave) resonators typically are costly parts that are not generally suited for fabrication by current integrated circuit (IC) technology. At present, a cellular transmitter can be implemented on a single IC chip, except for the ceramic or SAW stage resonators. Therefore, to reduce the transmitter's cost and make it more amenable for integration on an IC chip, it is desirable to eliminate the ceramic and SAW based resonators. One way to eliminate the ceramic or SAW resonator is to use a planar resonator. But planar resonators typically lack the required Q (quality factor) and therefore, limit the phase noise performance of an oscillator.

Reducing phase noise and realizing wideband tunability have been assumed to be opposing requirements due to the problem of the controlling loop parameters and the dynamic loaded Q of the resonator over wideband operation. The resistive losses, especially those in the inductors and varactors, are of major importance and determine the Q of a tank circuit. There have been several attempts to come to grips with these contradictory but desirable oscillator qualities. One way to improve the phase noise of an oscillator is to incorporate high quality resonator components such as surface acoustic wave (SAW) and ceramic resonator components. But these resonators are more prone to microphonics and phase hits. These resonators also typically have a limited tuning range to compensate for frequency drifts due to the variations in temperature and other parameters over the tuning range.

Ceramic resonator (CRO) based oscillators are widely used in wireless applications, since they typically feature very low phase noise at fixed frequencies up to about 4 GHz. CRO resonator-based oscillators are also known for providing a high Q and low phase noise performance. Typically, a ceramic coaxial resonator comprises a dielectric material formed as a rectangular prism with a coaxial opening running lengthwise through the prism and an electrical connector connected to one end. The outer and inner surfaces of the prism, with the exception of the end connected to the electrical connector and possibly the opposite end, are coated with a metal such as copper or silver. A device formed in this manner essentially comprises a resonant RF circuit, including capacitance, inductance and loss resistance that oscillates in a transverse electromagnetic (TEM) mode if loss resistance is compensated.

CRO oscillators, however, have some disadvantages, including a limited operating temperature range and a limited tuning range (which limits the amount of correction that can be made to compensate for the tolerances of other components in the oscillator circuit). CROs are also typically prone to phase hits (due to expanding and contracting at different rates with variation of the temperature for outer metallic body of the CRO and other components of the oscillator circuit).

In that regard, circuit designers sometimes consider designing a digitally implemented CRO oscillator to overcome the above problems, otherwise, large phase hits can occur. In addition, since the design of a new CRO oscillator is much like that of an integrated circuit (IC), development of an oscillator with a non-standard frequency requires non-recurring engineering (NRE) costs, in addition to the cost of the oscillators.

Due to the emergence of the mobile communications market, the need for a low cost, compact, and power efficient radio frequency (RF) circuit module is attracting considerable attention. The coexistence of second and third generation wireless systems generally requires multi-mode, multi-band, and multi-standard mobile communication systems. This, in turn, makes desirable a user-definable low cost and relatively high spectrally pure tunable signal source (e.g., voltage controlled oscillator (VCO) or oscillator). Mobile telephones and radios operating in several modes typically switch between receiving and transmitting frequencies, and, therefore, require low phase noise performance in each of the switched bands. Although separate VCOs may be used to switch between bands, this results in an increase in power consumption, the number of components, weight and cost, for example.

More specifically, mobile telephone receivers typically require the use of a VCO with a specific center frequency in order to process incoming signals. In mobile telephones that are adapted to operate in multiple modes, separate VCO circuits, each of which has a center frequency associated with one of the modes, are typically required to be present in the telephones in order to process received signals in the multiple modes. The use of multiple VCO circuits in multiple mode telephones increases the number of components required to implement such devices, and such circuits occupy valuable space on the circuit boards used for implementing the telephone. Using multiple self contained VCOs also has the disadvantage that it requires substantial circuitry, e.g., a complete set of self contained VCOs for the needed frequency band, each complete with a phase locked loop.

Thus, a need exists for methods and circuitry that overcome the foregoing difficulties, and improve the performance of an oscillator or oscillator circuitry, including the ability to absorb phase hits over the tuning range of operation. In addition, a need exists for VCOs that can reliably operate in multiple modes while avoiding the need for additional circuitry or multiple discrete VCOs.

SUMMARY OF THE INVENTION

One aspect of the present invention includes a tunable oscillator with a first transistor, a second transistor connected in parallel with the first transistor, a noise feedback and bias network connected to the first and second transistors, a planar coupled resonator network coupled to the transistors and a means for dynamically tuning the resonant frequency of the planar coupled network and the junction capacitance of the transistors.

In some implementations, the means for dynamically tuning may include a plurality of capacitive elements coupled across each junction of the first and second transistors. Each of the plurality of capacitive elements typically has a capacitance that is larger than the internal capacitance from the associated transistor junctions. Additionally, in most instances, the plurality of capacitive elements includes a first capacitor, a tuning diode in series with the first capacitor and a second capacitor in series with the tuning diode.

Certain implementations may include stubs that enable user definability in the planar coupled resonator network.

In some implementations, the first and second transistors of the tunable oscillator are bipolar junction transistors having respective base, collector and emitter terminals. In those implementations, the base terminal of the first transistor is coupled to the base terminal of the second transistor, the collector terminal of the first transistor is coupled to the collector terminal of the second transistor, and the emitter terminal of the first transistor is coupled to the emitter terminal of the second transistor. In addition, certain embodiments may include a resistor between the collector of the first transistor and the collector of the second transistor and/or a resistor between the base of the first transistor and the base of the second transistor for optimum noise factor, harmonic rejection and output power.

In some implementations involving bipolar junction transistors, the planar coupled resonator network may be coupled to the base terminals of the first and second transistors. Also, in some implementations involving bipolar junction transistors, the noise feedback and bias network is coupled across the collector and base terminals of the first and second transistors.

The noise feedback and bias network, in some embodiments, includes a voltage source and a pair of transistors coupled to the voltage source such that the voltage source biases the first and second transistors. Certain embodiments of the tunable oscillator include a buffer amplifier coupled to an output terminal of the first and second transistors.

Another aspect of the invention includes a tunable oscillator with a parallel configuration of three-terminal devices. The parallel configuration of three-terminal devices includes a first transistor and a second transistor connected in parallel with the first transistor. A noise feedback and bias network is connected to the first and second transistors. A planar coupled resonator network also is coupled to the first and second transistors. The oscillator includes several series circuits, each having a first capacitor, a tuning diode and a second capacitor. Each of those series circuits is connected across an associated one of the junctions of the parallel configuration of three-terminal devices.

In some implementations, the planar coupled resonator network desirably includes stubs that enable user definability in the oscillator. According to certain embodiments, each of the series circuits has a capacitance that is larger than the internal capacitance from the associated junctions.

Certain implementations of the tunable oscillator include first and second transistors that are bipolar junction transistors having respective base, collector and emitter terminals. In those implementations, the base terminal of the first transistor is coupled to the base terminal of the second transistor, the collector terminal of the first transistor is coupled to the collector terminal of the second transistor, and the emitter terminal of the first transistor is coupled to the emitter terminal of the second transistor. A resistor can be coupled between the collector of the first transistor and the collector of the second transistor. A resistor can be coupled between the base of the first transistor and the base of the second transistor for optimum noise factor, harmonic rejection and output power.

In implementations involving a pair of bipolar junction transistors, the planar coupled resonator network can be coupled to the base terminals of the first and second transistors. In implementations involving a pair of bipolar junction transistors, the noise feedback and bias network can be coupled across the collector and base terminals of the first and second transistors.

In some implementations, the noise feedback and bias network includes a voltage source and a pair of transistors coupled to the voltage source. In those instances, the noise feedback and bias network is adapted to bias the first and second transistors.

According to certain embodiments, the tunable oscillator includes a buffer amplifier coupled to an output of the first and second transistors.

Still another aspect of the invention includes a communications device with a transceiver and a tunable oscillator coupled to the transceiver. The tunable oscillator includes a first transistor, a second transistor connected in parallel with the first transistor, a noise feedback and bias network connected to the first and second transistors, a planar coupled resonator network coupled to the transistors and a means for dynamically tuning the resonant frequency of the planar coupled network and the junction capacitance of the transistors.

In some implementations, the means for dynamically tuning includes a plurality of capacitive elements coupled across each junction of the first and second transistors. Typically, each of the plurality of capacitive elements has a capacitance that is larger than the internal capacitance from the associated transistor junctions. The plurality of capacitive elements can include a first capacitor, a tuning diode in series with the first capacitor and a second capacitor in series with the tuning diode.

Certain embodiments of the planar coupled resonator network include stubs that facilitate user-definability.

In some implementations, the first and second transistors are bipolar junction transistors having respective base, collector and emitter terminals, wherein the base terminal of the first transistor is coupled to the base terminal of the second transistor, the collector terminal of the first transistor is coupled to the collector terminal of the second transistor, and the emitter terminal of the first transistor is coupled to the emitter terminal of the second transistor. In those implementations, a resistor can be coupled between the emitter of the first transistor and the emitter of the second transistor and/or a resistor can be coupled between the base of the first transistor and the base of the second transistor.

In implementations involving bipolar junction transistors, the planar coupled resonator network is typically coupled to the base terminals of the first and second transistors and the noise feedback and bias network is typically coupled across the collector and base terminals of the first and second transistors.

Certain embodiments of the communications device include a noise feedback and bias network with a voltage source and a pair of transistors coupled to the voltage source. The noise feedback and bias network is adapted to bias the first and second transistors.

A buffer amplifier typically is coupled to an output of the first and second transistors.

In accordance with the various aspects of the present invention, in a typical implementation, the techniques and structures disclosed herein provide a user-definable, low cost, low phase hits and relatively high spectral purity multi-band tunable oscillator. In preferred embodiments, carrier circuits implemented in accordance with this aspect of the invention typically provide improved phase noise performance for carrier frequencies of 622 MHz, 1000 MHz, and 2488 MHz typically better than −138 dBc/Hz (carrier frequency: 622 MHz), −134 dBc/Hz (carrier frequency: 1000 MHz), and −128 dBc/Hz (carrier frequency: 2488 MHz) at 10 kHZ offset from the carrier, respectively. Oscillators implemented in accordance with this aspect of the present invention are not, however, limited to these frequencies and may comprise other frequencies that are used, for example, in second, third, and later generation wireless systems. The phase noise improvement that can be realized is typically better than commercially available ceramic/SAW (surface acoustic wave) resonator based oscillators. These oscillators may, therefore, serve as an alternative or replacement for the SAW/ceramic resonator based oscillators.

In accordance with other aspects of the present invention, the techniques and structures disclosed herein provide a power efficient and cost-effective alternative to ceramic/SAW resonator based oscillators.

There are several different frequency bands allocated for the modern mobile communication. The most commonly used bands are located at approximately 450 MHz, 900 MHz, 1800 MHz, 1900 MHz, 2100 MHz, 2500 MHz and 5000 MHz. In accordance with the various aspects of the present invention, a single, user-definable, relatively high purity signal source across several different frequency bands can be provided. Those frequency bands include both existing and later generation wireless systems. In contrast, typically, more than one SAW/ceramic resonator based oscillators is required to meet the same requirements.

In an additional aspect, the present invention provides a reduction in phase noise by enabling the dynamic varying of junction capacitance across the three-terminal active devices (bipolar/FETs), noise-filtering network, and impedance transfer function of the planar-coupled resonator network. Also, circuitry implemented in accordance with the various aspects of the present invention provide a relatively high spectrally pure oscillator that is easier to manufacture. In addition, oscillators may be implemented that are compact and amenable for integration in chip form. Certain implementations provide freedom of selection of the frequency, low cost, low phase noise, low phase hits, low power consumption, compact size, electromagnetic interference (EMI) insensitive, amenability for integration in chip form, and stability over a wide range of temperatures as additional features.

In another aspect, the present invention provides a manufacturing method for an oscillator having relatively high spectral purity and that includes a dynamically tuned hybrid resonance mode network. Such an oscillator will typically be cost-effective and may also be produced in a compact package that is amenable to integration in chip form.

In accordance with additional aspects of the present invention, phase hits are reduced by implementing a distributed coupled resonator network in the buried layer of the circuit board (middle layer of the multi-layer board). By placing the resonators in middle layer of a PCB (printed circuit board) the effects due to microphonics from the cover that would otherwise degrade the oscillator performance are reduced.

In some aspects, the present invention offers a power efficient and cost-effective alternative to the ceramic/SAW resonator based oscillator. In addition, the present invention provides a user defined single high purity signal source for the several different frequency bands allocated for present and later generation wireless systems. These advantages may be desirably achieved by matching the optimum group delays corresponding to the resonance frequency to each respective output signal frequency for optimum phase noise performance, as disclosed in the description of the preferred embodiment, by dynamically incorporating additional resonance (hybrid resonance mode) for each output signal frequency at which the phase noise performance is optimum. As such, a multi-band high Q planar resonators that has larger group delay characteristics may be created, thereby allowing for sharper resonance and lower phase noise performance over a relatively wide tuning range, which is usually not otherwise possible to achieve by SAW, ceramic, quartz, and conventional planar resonator (distributed structure) based oscillators.

In another aspect, circuitry implemented in accordance with the present invention helps eliminate the need for multiple, separate VCOs for a multiple mode phone. In this regard, the circuitry provides multiple bands for a voltage-controlled oscillator, which is compact and amenable for integration in chip form.

In another aspect, a method may be implemented in accordance with the present invention. The method generally comprises providing a tank circuit with variable radio frequency impedance, which is dynamically optimized by selectively using additional series or shunt resonance networks in conjunction with variable junction capacitances across the negative resistance generative device (bipolar/FETs) for minimum noise transfer function in the closed loop.

A conventional voltage controlled oscillator typically has components (active and passive) mounted on the substrate aside from the resonator. Therefore, conventional voltage controlled oscillators usually have as a disadvantage a relatively large-size construction because a large substrate is needed to mount the resonator along with all the other parts that are needed. Such oscillators also have another disadvantage in that the resonator may be easily affected by an electromagnetic field outside the oscillator. Although this disadvantage may be overcome by shielding the resonator with a metal case or the like, the additional shielding results in an increase in the overall size of the oscillator.

In another aspect, the present invention provides a voltage controlled oscillator that has a resonator that is not easily affected by an external magnetic field, and which still has a compact construction. This aspect of the present invention is achieved by providing a voltage controlled oscillator that comprises a resonator formed on a substrate that is made up of a plurality of dielectric layers in a way to allow the structure to operate in dynamic hybrid resonance mode. In addition, a conductive film that effectively functions as a high Q inductor and electric landings are formed through vias between respective dielectric layers so that the electronic components (active and passive) are mounted on the surface of the substrate.

The conductive film and the electric lands on the surface of the substrate are connected with one another through holes or vias substantially filled with a conductive material in a way to avoid loading of the resonator in presence of the additional forced resonance (series or parallel), which is a function of the conduction angle and drive level of the oscillator RF current for minimum phase hits and noise performances.

Another aspect of the present invention is reduction of noise for favorable phase noise performance. Low noise VCO usually requires low DC bias current but the VCO's output power is low, and therefore, high-current operation for high output power results in high phase noise. To obtain a high power level and also keep the DC bias current as low as possible, the transistor $Q_1$ may be implemented as two or more transistors connected in parallel in such a way that the feedback capacitances can be eliminated/compensated by their equivalent junction capacitances (across base and emitter) for optimum noise transfer function, thereby, minimum phase noise performances. In this way, the DC current passing through each transistor is reduced (by a half, if a pair of transistors are used), and as a result, the total noise level is lower than that of a single transistor operating at the same output power level. The number of parallel-connected transistors depends on the technology in the IC processing, the output power level required, and the optimal bias point of a single transistor for minimum noise figure and optimum conduction angle and drive level across the desire-tuning band. From the transient analysis, the oscillation of a VCO starts with low gain will have lower noise than the oscillation of a VCO started with high gain. Therefore, in one aspect of the present invention, the resistance R across the emitter and feedback capacitors, in conjunction with other elements, such as the capacitors across the transistor junctions, reduces the gain at the moment oscillation starts. This invention advantageously provides a circuit topology for high power, low noise VCO that can replace the costly high quality ceramic and SAW resonator based oscillators. The typical values of the resistance, capacitances and transistor bias currents are determined by the particular application in which VCO is used based on frequency of operation and required tuning range. The present invention allows for a substantial reduction in phase noise by dynamically varying the junction capacitance of the three terminal active device (bipolar/FETs), noise-filtering network, conduction angle, drive level, noise transfer function and impedance transfer function of the planar-coupled resonator network.

Another aspect of the present invention includes a buffer amplifier for isolating the VCO from loading, thereby, avoiding any output signal frequency pulling due to changes in load impedance. For minimum noise factor, the buffer amplifier should operate in as linearly as possible in order to avoid added noise from higher order intermodulation distortions arising in the buffer stage.

In another aspect, the present invention also provides a manufacturing method for generating a high spectral purity oscillator, which is compact and amenable to integration in chip form. The freedom of selection of the frequency, low cost, low phase noise, low power consumption, compact size, amenable for integration in chip form, and stable over temperature will make this technology promising and attractive for next generation high frequency mobile communication systems. Because of its simplicity and the absence of bulky resonators (SAW/Ceramic), a VCO in accordance with this invention is easy to fabricate with a power amplifier on a single IC chip. Fabricating the VCO with the power amplifier on a single IC chip can significantly reduce product cost. This approach may eliminate the costly CRO and SAW resonator, therefore, high spectral purity VCO's performance.

A low phase noise VCO is provided in accordance with an aspect of the present invention. In one embodiment, the VCO comprises a negative resistance generator device ($Q_1$) and a resonator structure (planar coupled buried layer resonator) that reduce VCO phase noise. An advantage of this embodiment is its relatively low manufacturing cost when compared to the manufacture of other VCOs. By using the foregoing techniques, ultra low noise oscillators can be made with a degree of accuracy previously attainable only by much more complex and costly resonators such as SAW and ceramic resonators.

Another aspect of the present invention is the provision of a user defined single high purity signal source for the several different frequency bands allocated for present and later generation wireless systems, which otherwise needed several SAW/Ceramic resonator based oscillators to meet the same requirement. This voltage-controlled oscillator provides a low noise signal source with reduced phase hits in comparison to the high Q resonator based oscillator such as ceramic and SAW resonator based oscillator.

In another aspect, the present invention is the provision of a manufacturing method or process for making a high spectral purity oscillator, which is insensitive to phase hits and amenable for integration in chip form. In one embodiment, the lower frequency range (between about 0.6 GHz and 5 GHz) associated with a high rate of phase difference change is configured to provide the highest rate of phase difference change possible and the lowest insertion loss possible. Insertion loss represents an amount of power lost as a signal passes through a device, such as coupled resonators. A network that exhibits a high rate of phase difference change and low insertion loss will inherently have a high-unloaded Q. Another advantage of one embodiment of the VCO is its lower phase noise compared to conventional microstrip/stripline coupled resonators. In one embodiment, low phase noise performance is achieved by suitably configuring the impedance transfer function of the resonator by incorporating stubs, dynamically tuned junction capacitance (Q1), drive level, and noise-filtering network across the emitter.

Another aspect of the present invention is the provision of a distributed coupled resonator (DCR) based oscillator with low phase hits. One preferred embodiment is an oscillator including a resonant structure selected to resonate at a frequency, and an active impedance parallel coupled to the resonant structure. The active impedance created by the 3-terminal active device further has a negative real part with a real magnitude and an imaginary part with an imaginary magnitude. The real magnitude is a function of the imaginary magnitude and the imaginary magnitude is selected such that the real magnitude compensates the loss of the resonator as well coincides with a maximum-slope inflection point of the phase characteristic curve for improved group delay. The resonator structure is, preferably, a resonator in distributed medium in buried layer.

In another aspect of the present invention, the resonant structure is selected to have a parallel resonant frequency that is below the desired or nominal operating frequency of the oscillator. By incorporating selective stubs ($S_1$, $S_2$, $S_3$, $S_4$, $S_5$, $S_6$, $S_7$, $S_8$) in conjunction with the parallel tuned resonator improves the impedance level at the oscillator frequency, thereby, support a relatively large voltage swing and improvement in signal to noise ratio of the oscillator circuit. A further aspect of the invention is to provide a method of creating a wideband oscillator circuit with the phase requirements for simultaneously tuning of series and parallel resonance conditions over the band. The aforementioned aspects are achieved according to the invention by a method of frequency locking a first parallel tuned resonator with at least a second series tuned resonator and circuit, and also an arrangement that generates the steepest phase characteristics and that is tunable over a wider range. Such an oscillator may operate in a high impedance mode. The aforementioned objects are achieved according to the invention by a method of independently resonating a first parallel tuned circuit with a second series tuned circuit and combined them therefore for improved loaded Q.

Another aspect of the present invention is to provide a method of reducing phase noise of oscillators/VCOs, for example, series and parallel tuned oscillators. A further aspect of the invention is to minimize the microphonics, more particularly, microphonics in oscillators/VCOs used in a communication device, where phase hits are a real and growing problem. A further aspect of the invention is reduction of phase hits in an oscillator circuit for use in communication systems, such as frequency synthesizer. A method of the present invention comprises tuning the oscillator/VCO to account for temperature differences or component variations.

In general, the circuit topology and layout of a resonator implemented in accordance with the present invention is selected in such a way that it supports uniform negative resistance over the tuning range and includes a multi-coupled distributed resonator thereby improving the time average loaded Q. Such a topology and layout is less prone to phase hits over the tuning range.

With regard to the state of the art of the ultra low phase noise, the various aspects of the present invention allows for dynamically tracking of the resonance mode, negative resistance, noise filter and tracking output filter, thereby allowing the oscillator to be dynamically tuned over the band for the best phase noise and low microphonics. Furthermore, the basic structure can be extended for other applications, which have similar kind of requirements.

In order to allow a user more freedom, phones may be expected to operate using multiple frequency bands. Certain implementations of the circuits disclosed herein a user definable single high purity signal source for the different frequency bands allocated for present and later generation wireless systems. Such a source avoids the need for having several SAW/ceramic resonator based oscillators to support multi-band performance.

Other features and advantages will be apparent from the following description, drawings and the claims.

BRIEF DESCRIPTION OF THE DRAWINGS

Like reference numerals refer to like elements.

DETAILED DESCRIPTION

Figure 2:
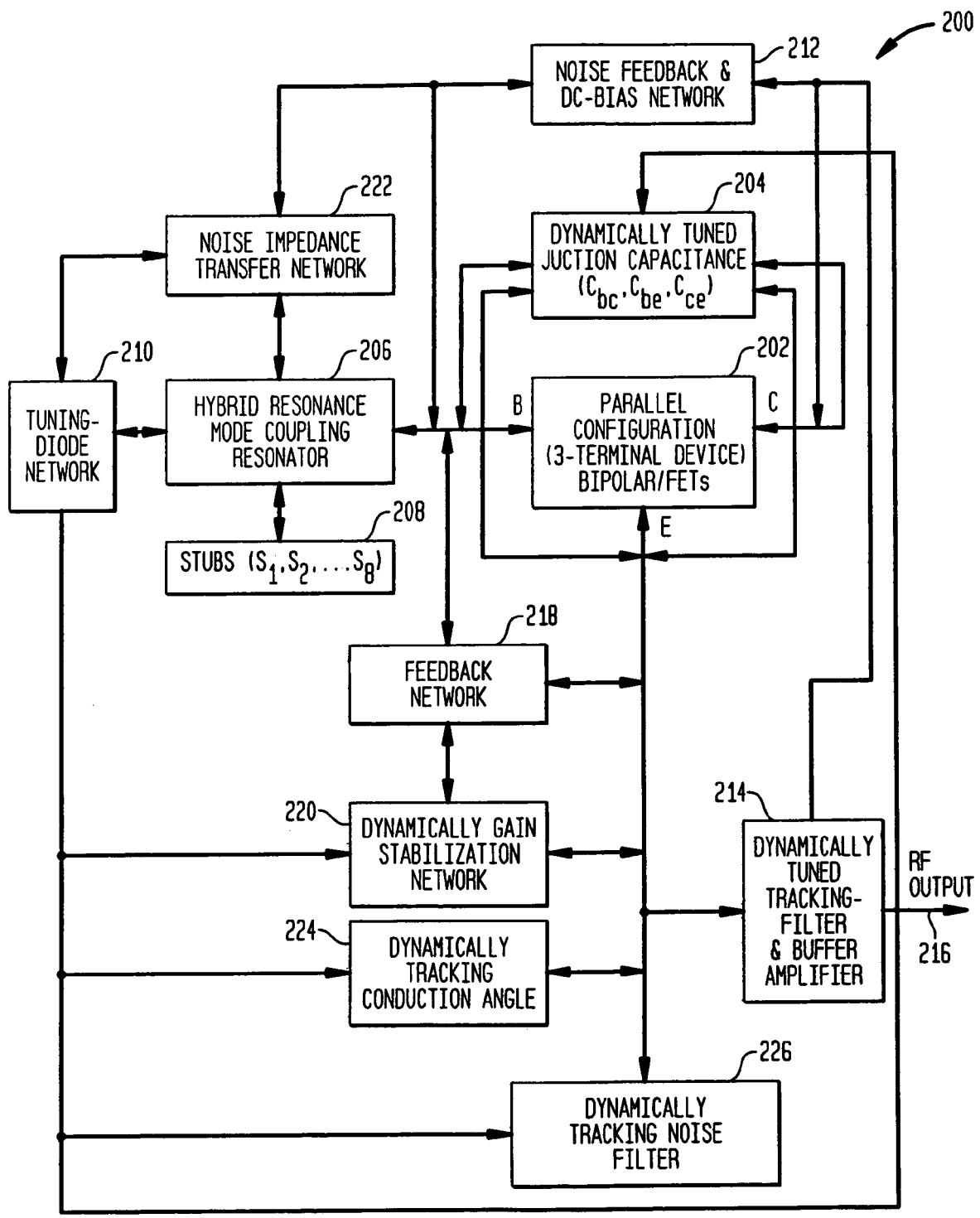
FIG. 2 is a block diagram of an implementation of an oscillator.

FIG. 2 is a block diagram of an oscillator 200 in accordance with an aspect of the present invention.

The illustrated oscillator 200 includes a parallel configuration of three-terminal devices 202. In some implementations, the three-terminal devices include transistors, such as bipolar junction transistors (BJTs) and/or field effect transistors (FETs). In those implementations, the transistors are connected in parallel with one another by either directly or indirectly connecting corresponding terminals of each device together. In the illustrated implementation, the parallel configuration of three-terminal devices 202 includes BJTs. As such, the parallel configuration of three-terminal devices has, itself, three-terminals respectively corresponding to a common base terminal (labeled "B"), a common collector terminal (labeled "C") and a common emitter terminal (labeled "E").

A dynamically tuned junction capacitance means 204 is coupled across each junction of the parallel configuration of three-terminal devices 202. More particularly, the dynamically tuned junction capacitance means 204 is coupled across the base-collector junction, across the base-emitter junction and across the collector-emitter junction. The dynamically tuned junction capacitance means 204 facilitates dynamic tuning of the capacitance across each of the junctions of the parallel configuration of three-terminal devices 202. The dynamically tuned junction capacitance means 204 also facilitates fast convergence by dynamically tuning the noise impedance transfer function of the resonating network and the negative resistance generating device to improve noise performance over the tuning range.

In some implementations, the active part of the dynamically tuned capacitance means includes capacitive elements connected across the internal junction capacitances of transistor. Typically, each capacitive element has a capacitance that is greater than a value of the respective junction capacitance with which it is connected in parallel. The linear tunable capacitance across the junctions of the active device compensates for changes in the junction capacitances due to the variation of supply voltage as well as variation of temperature. The active part may include a plurality of transistors connected in parallel for reducing an operating bias current passing through each respective transistor for optimum noise performance. The active part may further include an RC network across the emitter of the transistor(s) and feedback capacitors, for reducing a gain and noise filtering of the active part when oscillation starts.

A hybrid resonance mode coupling resonator 206 is coupled to the base terminal of the parallel configuration of three terminal devices 202. A plurality of stubs 208 are coupled to the hybrid resonance mode coupling resonator 206. A tuning-diode network 210 is coupled to the base terminal of the parallel configuration of three terminal devices 202 through the hybrid resonance mode coupling resonator 206.

A noise feedback and DC Bias network 212 is coupled across the collector and emitter terminal of the parallel configuration of three-terminal devices 202. The noise feedback and DC Bias network 212 assists in stabilizing the oscillation frequency when variations occur in temperature and supply voltage Vcc. The noise feedback DC Bias network 212 also feeds noise back to the base of the parallel configuration of three-terminal devices 202.

The noise feedback and DC-Bias network 212 is coupled to the emitter terminal of the parallel configuration of three-terminal devices 202 through a dynamically tuned tracking filter and buffer amplifier 214.

A feedback network 218 is coupled across the base and emitter terminals of the parallel configuration of three-terminal devices 202. The feedback network 218 is also coupled to a dynamic gain stabilization network 220. The dynamic gain stabilization network 220 is coupled across the emitter and base terminals through the tuning diode network 210 and the hybrid resonance mode coupling resonator 206. The coupled resonator network 206 is also connected to a noise impedance transfer network 222, which is connected to the noise feedback and DC bias network 212. Means for dynamically tracking the conduction angle 224 associated with the parallel configuration of three-terminal devices 202 is coupled across the base and emitter terminals thereof through the tuning diode network 210 and the hybrid resonance mode coupling network 206. A dynamically tracking noise filter 226 is coupled to the emitter terminal and tuning-diode network 210.

The oscillator 200 operates as described herein and provides an RF output at 216 through the tracking-filter and buffer amplifier block 214.

In some implementations, the illustrated circuit is connected to a transceiver (not shown) and forms a communication device, such as a wireless telephone. In one implementation the transceiver is adapted to transmit and receive data. In other implementations, the transceiver is adapted to either transmit data only or to receive data only.

Figure 3A:
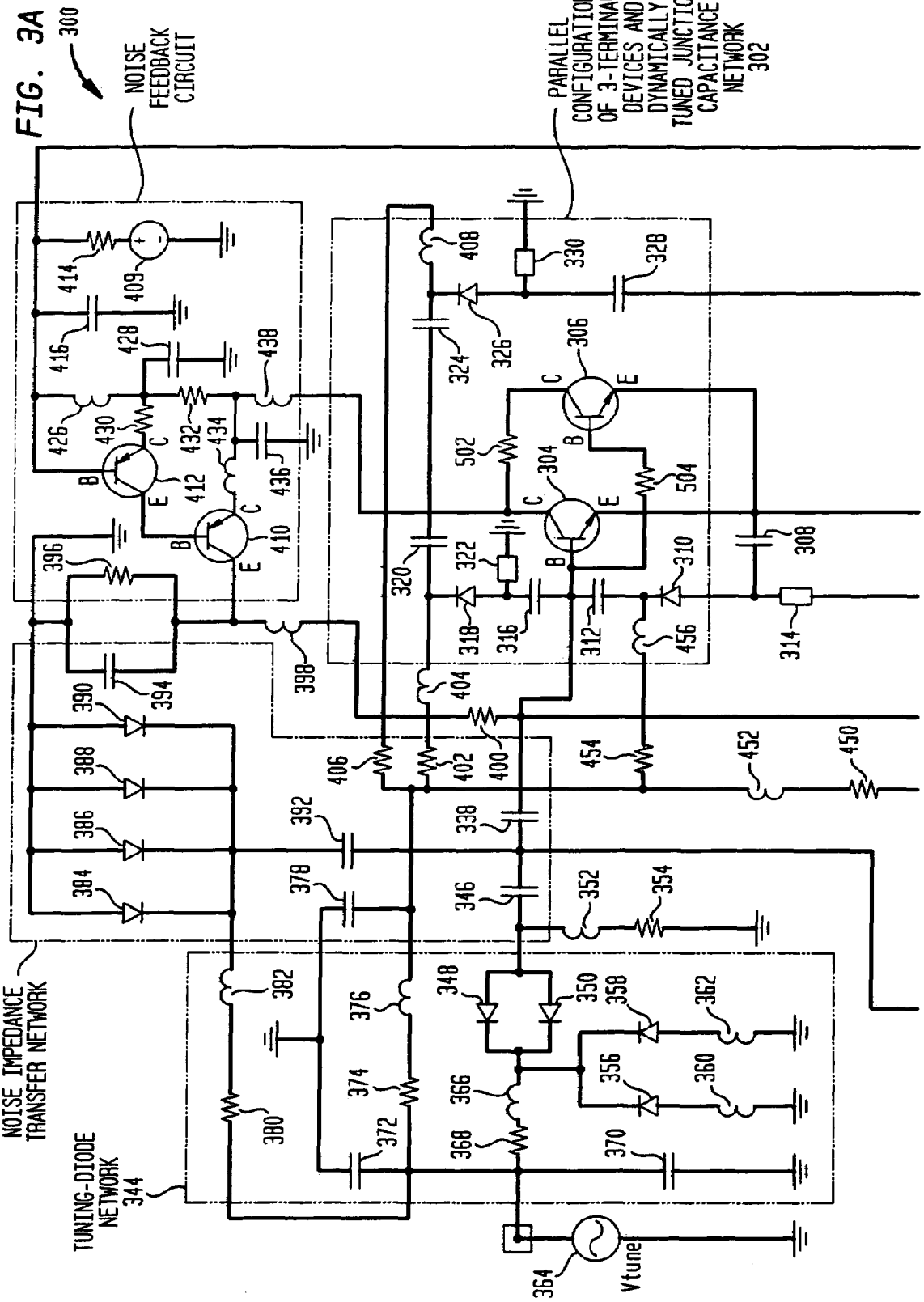
FIG. 3 is a schematic diagram of an implementation of an oscillator.

FIG. 3 is a schematic of an implementation of an oscillator 300 in accordance with an aspect of the present invention.

The illustrated oscillator 300 includes a network 302 that includes a parallel configuration of three-terminal devices and a means for dynamically tuning the junction capacitance. The illustrated three-terminal devices are a pair of NPN-type bipolar junction transistors 304, 306. Each transistor 304, 306 has an associated base, emitter and collector terminal, respectively labeled "B", "E" and "C". The transistors 304, 306 are connected to each other in parallel. More particularly, the base of transistor 304 is connected to the base of transistor 306, the collector of transistor 304 is connected to the collector of transistor 306 and the emitter of transistor 304 is connected to the emitter of transistor 306. Accordingly, the illustrated transistors 304, 306 share a common base terminal, a common collector terminal and a common emitter terminal.

Across each junction defined by the common terminals are two capacitors and a tuning diode (also known as varicap diode or varactor diode) between the two capacitors. For example, capacitors 308, 312 and tuning diode 310 are connected across the junction between the common emitter and the common base. More particularly, the common emitter is connecter to the capacitor 308, which is connected to the anode of the tuning diode 310 and the cathode of the tuning diode 310 is connected to capacitor 312, which is connected to the common base. The anode of tuning diode 310 is grounded through transmission line 314. Similarly, capacitors 316, 320 and tuning diode 318 are connected across the junction between the common base and the common collector. More particularly, the common base is connected to the capacitor 316, which is connected to the anode of the tuning diode 318 and the cathode of the tuning diode 310 is connected to the capacitor 320, which is connected to the common emitter. The anode of the tuning diode 318 is grounded through transmission line 322. Likewise, capacitors 324, 328 and tuning diode 326 are connected across the junction between the common emitter and the common collector. More particularly, the common emitter is connected to the capacitor 326, which is connected to the anode of the tuning diode 326 and the cathode of the tuning diode 326 is connected to the capacitor 324, which is connected to the common collector. The anode of the tuning diode 326 is grounded through transmission line 330. Capacitor 328 is connected to ground through capacitor 329.

The illustrated tuning diodes 310, 318 and 326 are configured so as to be generally reverse-biased. The width of the depletion zones in those tuning diodes 310, 318, 326 varies with the applied voltage. Since the capacitance associated with those tuning diodes is related to the width of the depletion zones, the capacitance of the tuning diodes 310, 318, 326 varies as the applied voltage varies. Generally, each depletion region width is proportional to the square root of the voltage across the tuning diode; and capacitance is inversely proportional to the depletion region width. Thus, the capacitance of a given tuning diode is inversely proportional to the square root of the voltage across that tuning diode. As junction voltage changes, so too does the capacitance across the junction.

The illustrated implementation also includes a resistor 502 between the collector terminals of transistors 304, 306 and a resistor 504 between the base terminals of transistors 304, 306. In one implementation, those resistors 502, 504 have zero resistance and, therefore, represent direct connections between the associated terminals. In those implementations, the illustrated circuit can operate at a very high power. In other implementations, the resistors 304, 306 have some finite amount of resistance. In those implementations, the resistors 304, 306 can be sized to optimize minimization of phase noise. Additionally, the values of resistance in resistors 304, 306 can differ, which biases transistor 304 different than the biasing of transistor 306. In still other implementations, the collectors of transistors 304, 306 are not connected to each other at all and are connected to different biasing voltage sources.

A feedback network 330 is coupled to the common base of the parallel configuration of three-terminal devices. The illustrated feedback network 330 includes two capacitors 332, 334 connected in series and grounded.

A hybrid resonance node coupling network 336 is coupled to the common base of the parallel configuration of three-terminal devices through capacitor 338. The illustrated hybrid resonance node coupling network 336 includes a plurality of micro-stripline resonators 340 and stubs 342 (S1, S2, S3, S4, S5, S6, S7, S8) that are coupled to each other as illustrated. Including multiple stubs 342 (S1, S2, S3, S4, S5, S6, S7 and S8) provides a broad range of frequencies for the circuit. The illustrated hybrid resonance coupling network facilitates user definability in the circuit as well.

A tuning diode network 344 is coupled to the common base of the parallel configuration of three-terminal devices through capacitor 338 and capacitor 346. The illustrated tuning diode network 344 includes a pair of diodes 348, 350 connected in parallel with each other. The anodes of those diodes 348, 350 are capacitively coupled to the common base and are connected to ground through inductor 352 and resistor 354. The cathodes of the diodes 348, 350 are connected to ground through two parallel paths, each of which includes a diode 356, 358 and an inductor 360, 362 connected to the anode of its associated diode 356, 358. The cathodes of the diodes 348, 350 are connected to the cathodes of diodes 356, 358. The cathodes of diodes 348, 350, 356, 358 also are connected to a tuning voltage source 364 through inductor 366 and resistor 368. The output of the tuning voltage source 364 is capacitively coupled to ground through capacitor 370 and capacitor 372. The output of the tuning voltage source 364 also is coupled to ground through resistor 374, inductor 376 and capacitor 378. The ungrounded side of capacitor 378 is coupled to the common collector of the parallel configuration of three-terminal devices through resistor 402, inductor 404 and capacitor 320 and through resistor 406, inductor 408 and capacitor 324. Additionally, the tuning voltage source 364 is connected to a resistor 380, which is connected to inductor 382, which is connected to the cathodes of four diodes 384, 386, 388, 390. Those cathodes also are coupled to the base of the parallel configuration of three-terminal devices through capacitors 392 and 338. The anodes of the four diodes 384, 386, 388, 390 are connected together and grounded. They also are connected to a parallel configuration of a capacitor 394 and a resistor 396, which is coupled to the common base of the parallel configuration of three-terminal devices through inductor 398 and resistor 400.

A noise feedback circuit 407 is connected to the common collector terminal transistors 304, 306. The noise feedback circuit 407 includes a DC voltage source 409 that is used for biasing the transistor 304, 306 by providing a predetermined voltage at the common collector terminal. The noise feedback circuit 407 also includes two transistors 410, 412 and associated circuit elements that couple a portion of the common emitter terminal to the common base terminal of transistors 304, 306. Although the illustrated transistors 410, 412 are pnp type bipolar junction transistors, other implementations include other types of transistors.

The DC voltage source is connected to a resistor 414. The resistor 414 is connected to ground through capacitor 416 and through capacitor 418. The resistor also is connected to the circuit output terminal 420 through a resistor 422 and a dynamically tuned tracking filter and buffer amplifier network 424.

In the noise feedback circuit 407, the collector of transistor 412 is connected to the base of transistor 410. The base of transistor 412 is connected to DC voltage source 409 through resistor 414, is grounded through capacitor 416 and through inductor 426 and capacitor 428 and is connected to the dynamically tuned tracking filter and buffer amplifier network through resistor 422. The emitter of transistor 412 is connected to a resistor 430, which is connected between inductor 426 and capacitor 428. The resistor 430 also is connected to emitter of transistor 410 through resistor 432 and inductor 434. The node between resistor 432 and inductor 434 is grounded through capacitor 436 and is connected to the common collector terminal of transistors 304 and 306 through inductor 438. The collector of transistor 410 is connected to the node between the parallel configuration of capacitor 394 and resistor 396 and the inductor 398. The emitter of transistor 410 is connected to inductor 434.

Referring again to the parallel connected transistors 304, 306, the common emitter terminal is connected to a dynamically tuned gain stabilization and conduction angle network 440. More particularly, the common emitter is connected to two capacitors 442, 446 and a resistor 444. Capacitor 442 and resistor 444 are connected in parallel and are connected to a common node between capacitors 332 and 334 of the feedback network 330. Capacitor 446 is connected to the cathode of diode 448. The cathode of diode 448 also is connected through the series connection of resistor 450, inductor 452 and resistor 454 to inductor 456 of the parallel configuration of three-terminal devices and dynamically tuned junction capacitance network 302. Inductor 456 is connected to the cathode of diode 310. The cathode of diode 448 also is connected to the parallel configuration of three-terminal devices and dynamically tuned junction capacitance network 302 through the series connection of resistor 450, inductor 452, resistor 402 and inductor 404, which is connected to the cathode of diode 318 in the network 302. The cathode of diode 448 also is connected through the series connection of resistor 450, inductor 452 and resistor 406 to inductor 408 of the parallel configuration of three-terminal devices and dynamically tuned junction capacitance network 302. The anode of diode 448 is connected to ground.

The common emitter of transistors 304, 306 also is connected to a dynamically tuned tracking noise filter network 458. More particularly, the common emitter is connected to inductor 460 and capacitor 329 in the dynamically tuned tracking noise filter network 458. Inductor 460 is coupled to the dynamically tuned tracking filter and buffer amplifier network 424 through variable capacitor 462. The node between inductor 460 and variable capacitor 462 is connected to inductor 464, which is connected to ground through several parallel paths. Those paths include a path through resistor 466, a path through capacitor 468, a path through capacitor 470 and diode 472 and a path through capacitor 470 and capacitor 474. Capacitors 470 and 474 are connected to the cathode of the diode 472. The cathode of diode 472 also is connected via inductor 476 and resistor 478 to the cathode of diode 448 in the dynamically tuned gain stabilization and conduction angle network 440.

The dynamically tuned tracking filter and buffer amplifier network 424 includes an operational amplifier 480. The output terminal of the operational amplifier 480 is coupled to inductor 482, which is connected to resistor 422. The output terminal of the operational amplifier 480 also is connected to capacitor 484. Capacitor 484 is grounded through variable capacitor 486 and is coupled to an outlet terminal 420 through capacitor 488.

FIGS. 4, 5, 6 and 7 are circuit layouts of devices that include an oscillator in accordance with various implementations of the present invention.

Figure 4:
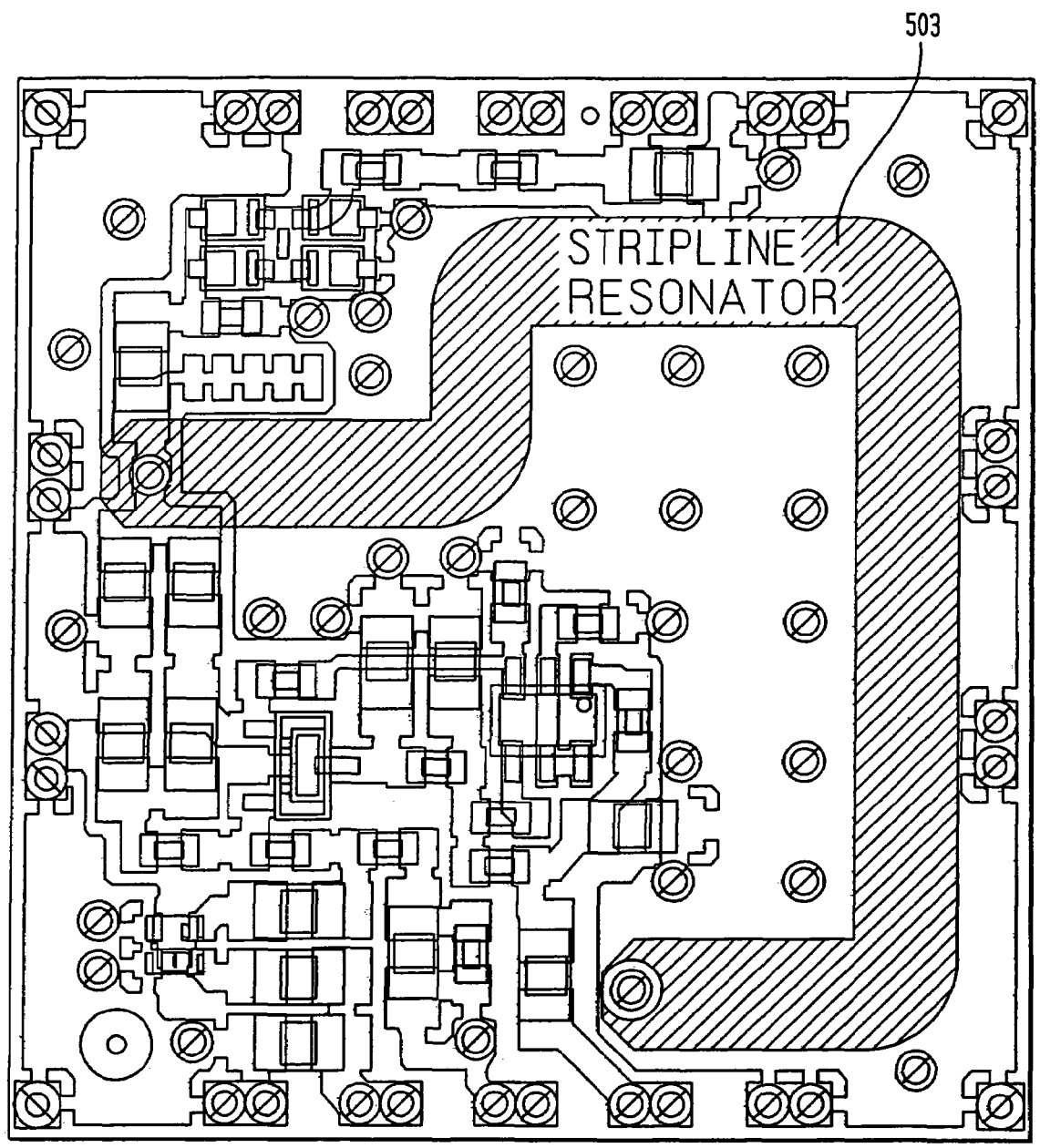
FIG. 4 is a layout of an oscillator with a stripline resonator.

FIG. 4 shows a layout of a device having an oscillator circuit that includes a stripline resonator 503. The stripline resonator 503 includes a flat strip of metal sandwiched between two parallel ground planes. Insulating material of the substrate can act as a dielectric. The width of the strip, the thickness of the substrate and the relative permeability of the substrate typically determine the characteristic impedance of the strip which act as a transmission line. In most instances, the central conductor need not be equally spaced between the ground planes. Generally, the dielectric material may be different above and below the central conductor.

Implementations of the illustrated layout helps minimize the effects of stray coupling to nearby objects. The two ground planes essentially shield the transmission line conductor from the effects of nearby bodies and serves to confine the electromagnetic fields to the region between the ground planes. To construct an electronic circuit with stripline, the desired transmission line conductor is typically sandwiched between two ground planes. The components are then connected to various transmission line conductors.

The illustrated implementation is typically suited for applications involving a single operating frequency.

Figure 5:
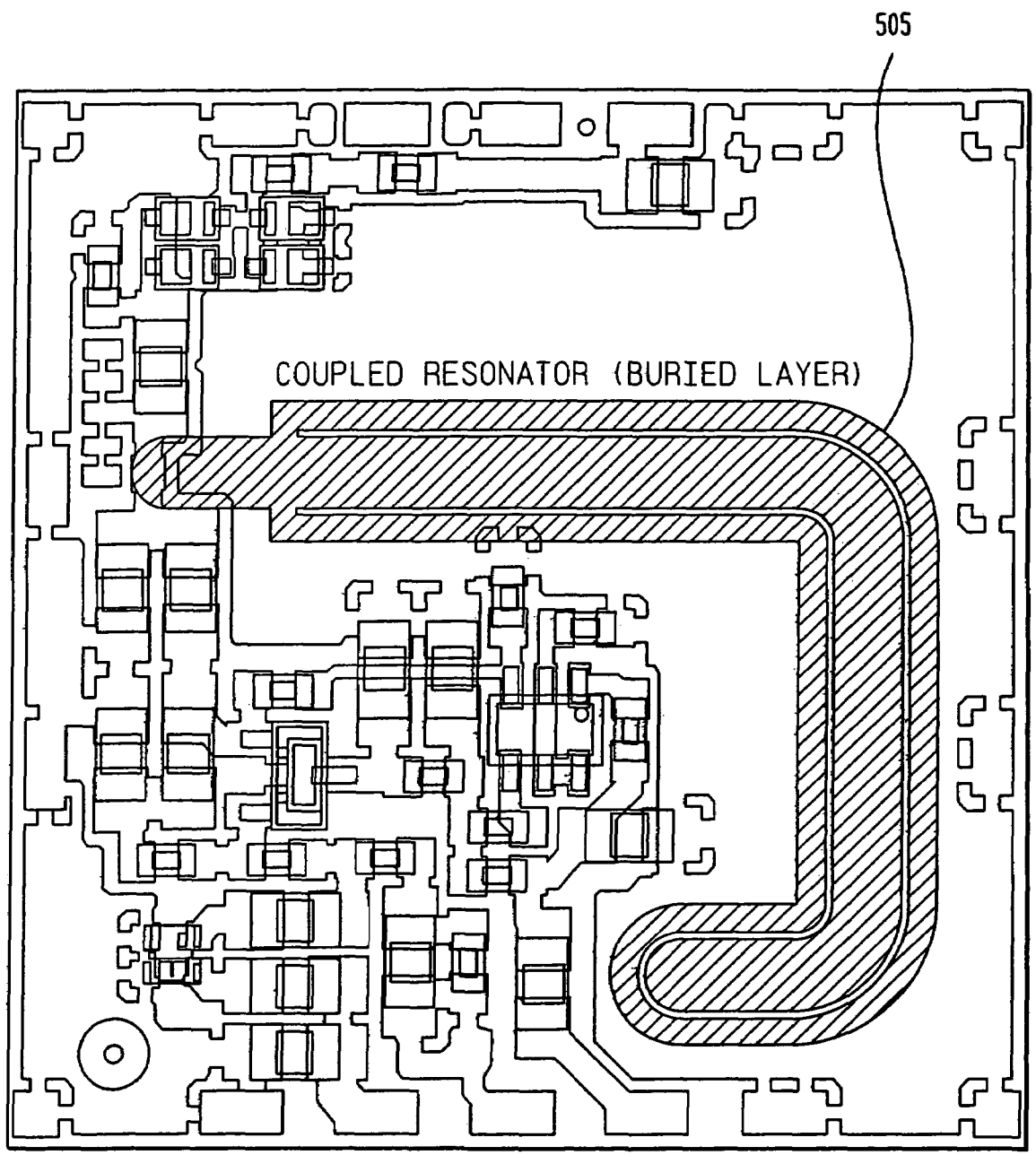
FIG. 5 is a layout of an oscillator with a coupled resonator (buried layer).

FIG. 5 shows a layout of an oscillator circuit with a buried coupled resonator 505. In some implementations, phase hits are reduced by implementing a coupled resonator in the buried layer of the circuit board (middle layer of the multi-layer board). By placing the resonator in the middle layer of a PCB (printed circuit board) the effects due to microphonics that might otherwise degrade an oscillator's performance are reduced. Typically, implementations of the layout shown in FIG. 5 provide good control of phase noise.

Figure 6:
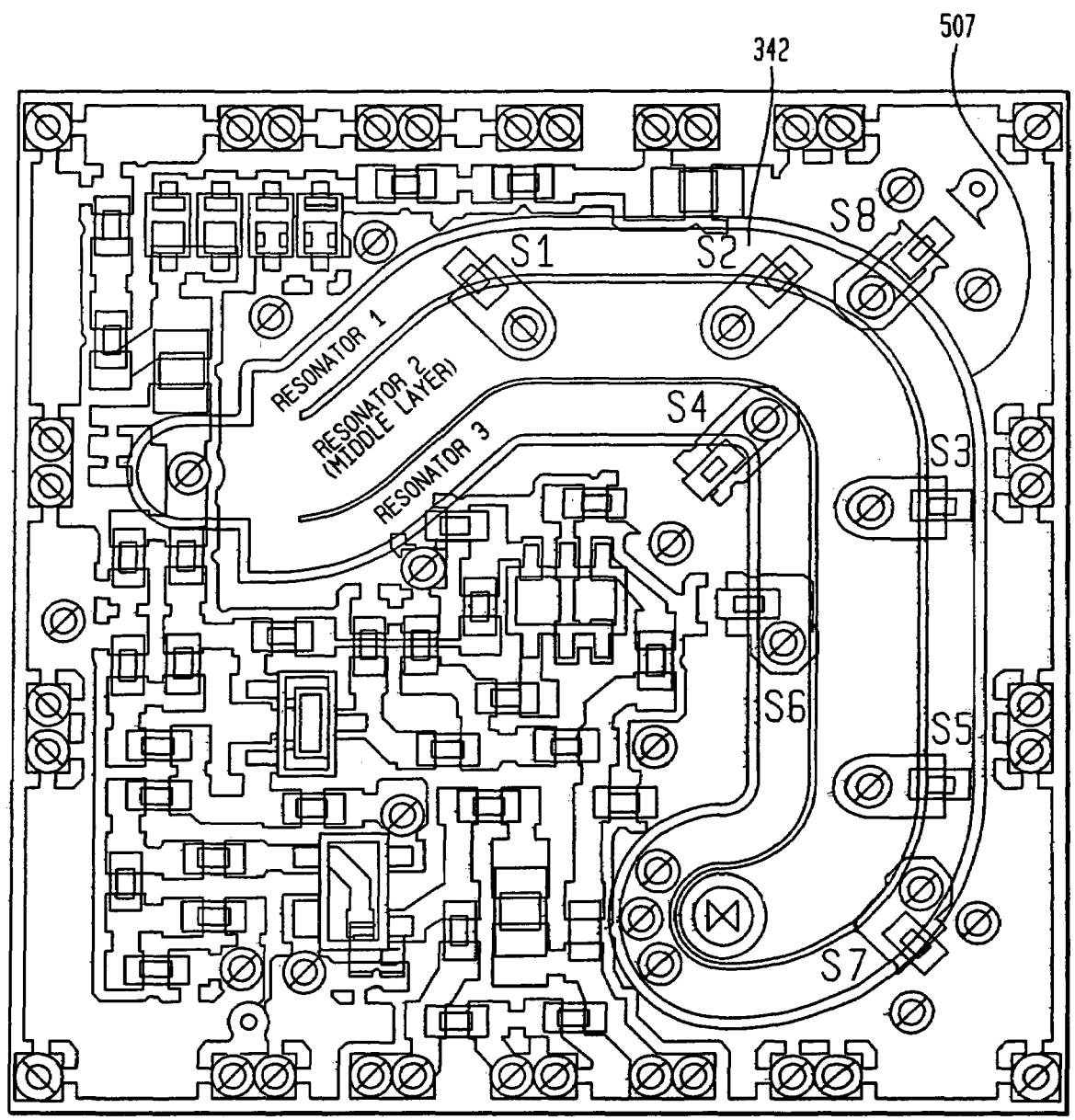
FIG. 6 is a layout of an oscillator with stubs.
Figure 7:
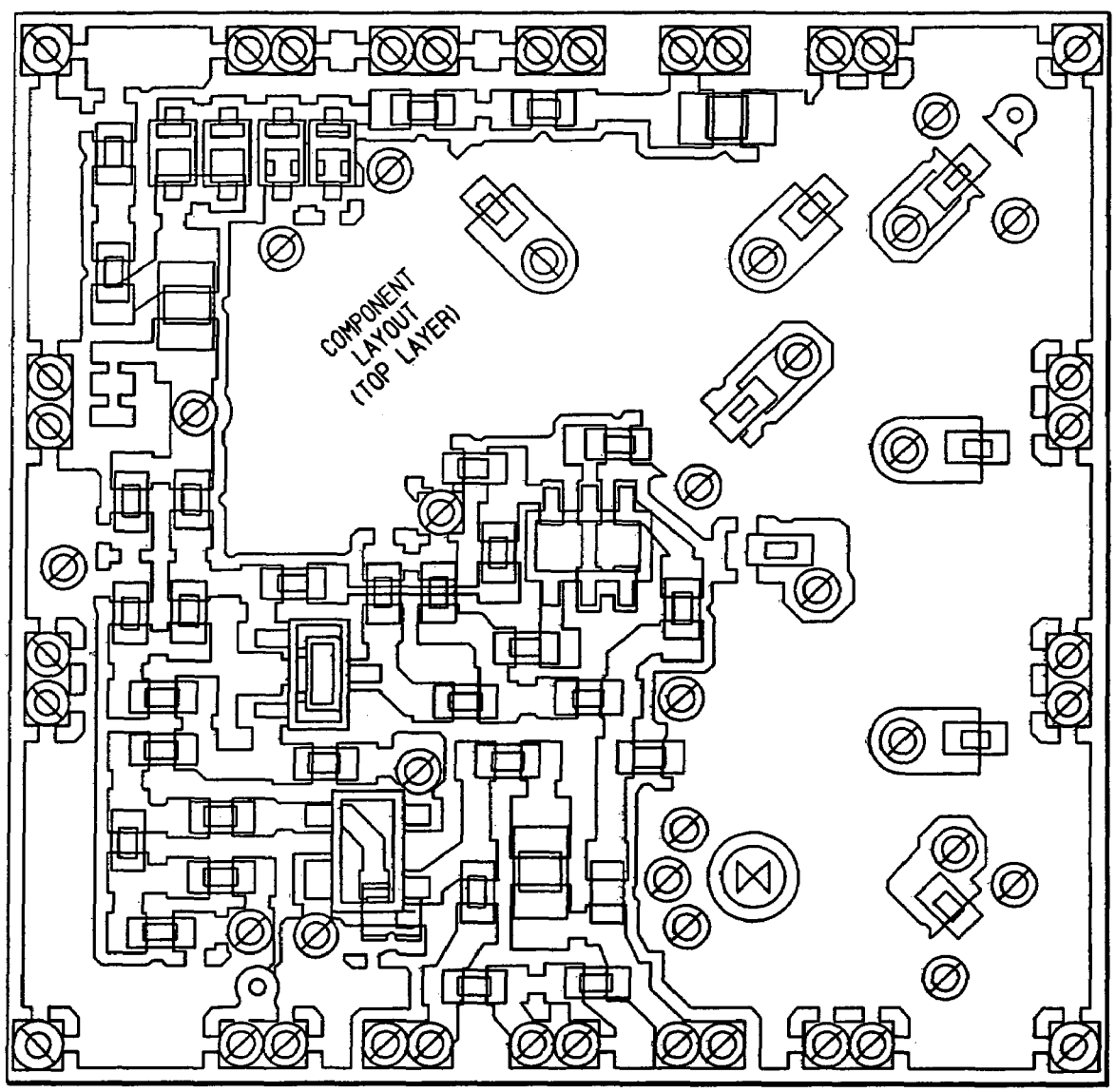
FIG. 7 is a layout of a top layer of the oscillator of FIG. 6.

FIG. 6 is a layout of a middle layer of a device that includes an oscillator. The middle layer includes three resonators 507 and stubs 342 (S1, S2, S3, S4, S5, S6, S7 and S8). The stubs 342 enable a user to define operating parameters of the oscillator. More particularly, the stubs 342 enable a user to adjust the impedance, the capacitance and inductance of the oscillator. FIG. 7 illustrates a top layer layout of the device shown in FIG. 6.

The series and parallel stubs help control the resonance frequency and tuning range of the multiple coupled resonators network and are incorporated in the same oscillator. The centre frequencies of the multiple oscillators are chosen such that their operating intervals overlap. The stubs also help to optimize the quality factor of the resonator. The illustrated resonator structure is fabricated in the middle layer of a printed circuit board and its performance includes a Q factor (50-ohm load), which typically is more than 125 over the entire modern wireless frequency band (600-5000 MHz).

Figure 8:
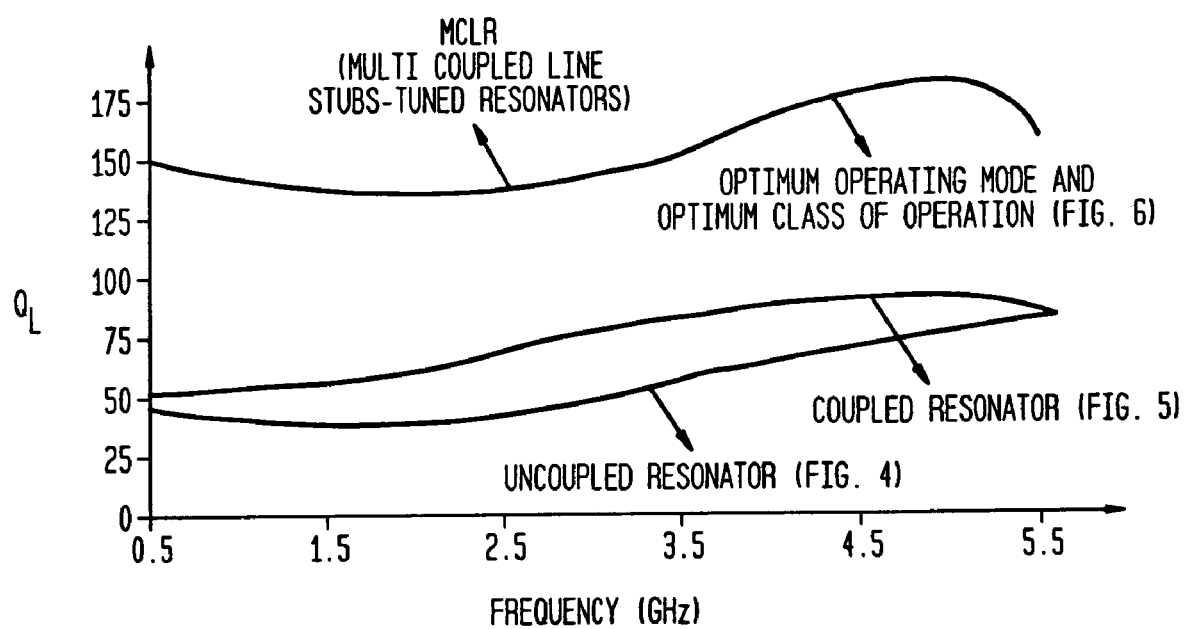
FIG. 8 is a plot of Q-factor versus frequency for various oscillator arrangements.

FIG. 8 is a plot of Q factor (with a 50 ohm load) versus frequency for three different oscillator layouts. The curve labeled "uncoupled resonator (FIG. 4)" is for a circuit having a layout that includes an uncoupled resonator, similar to the stripline resonator of FIG. 4. The curve labeled "coupled resonator (FIG. 5)" is for a similar circuit, but one with a layout that includes a resonator similar to the coupled resonator shown in FIG. 5. The curve labeled "MCLR (multi coupled line stubs-tuned resonators)" is for a circuit having a layout that includes a resonator layout similar to the layout shown in FIGS. 6 and 7. As shown, an oscillator's Q-factor can be improved by implementing an appropriate resonator layout.

Figure 9:
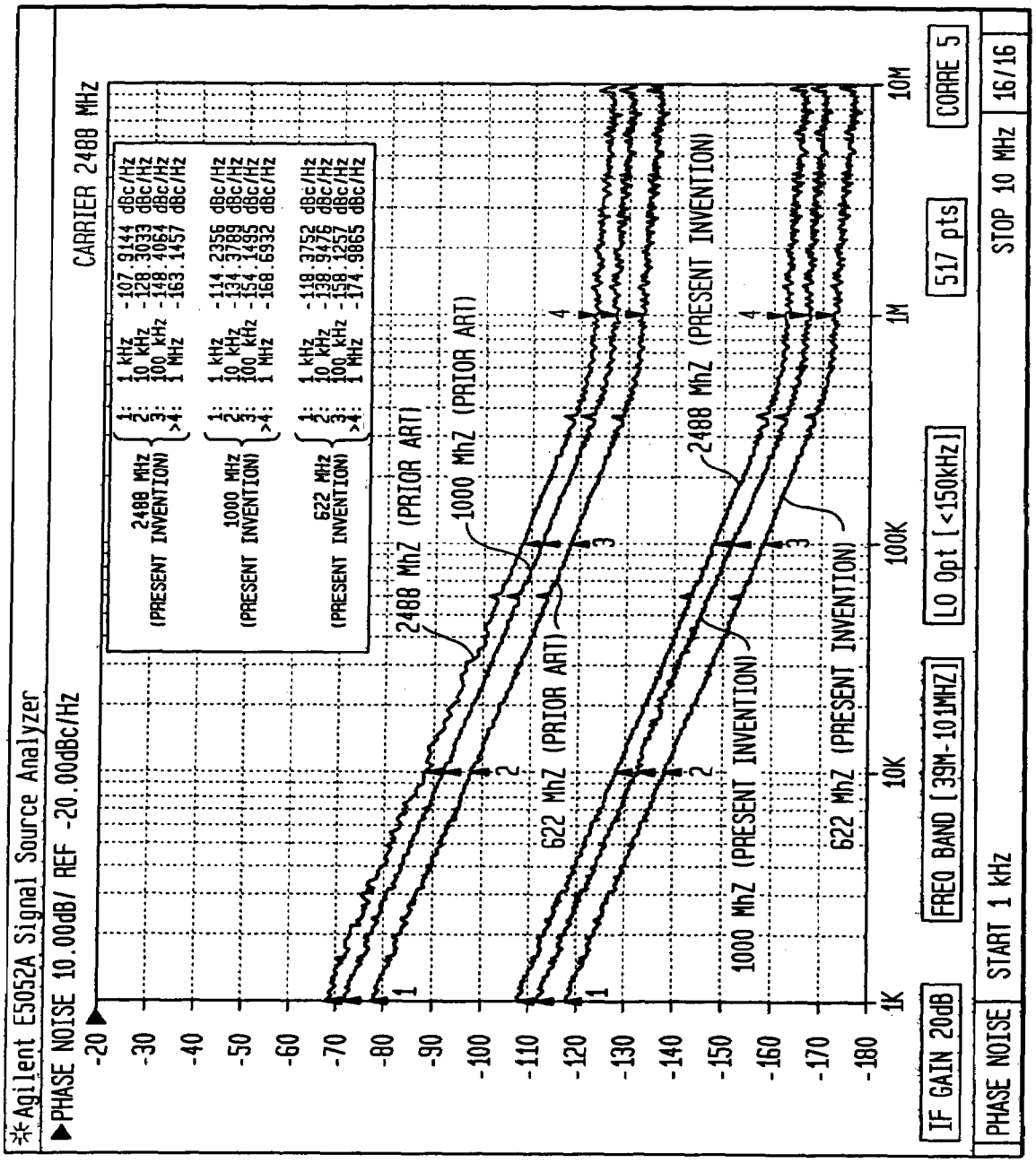
FIG. 9 is a plot of phase noise versus frequency for an oscillator.

FIG. 9 is a plot of phase noise against frequency for prior art oscillator circuits and for an oscillator circuit as shown in FIG. 2 of the present application. Three curves are shown for each oscillator circuit, respectively corresponding to 622 MHz, 1000 MHz and 2488 MHz carrier frequencies. As shown, the oscillator circuit according to FIG. 2 of the present application enjoys lower phase noise, for each carrier frequency and at 1 kHz, 10 kHz, 100 kHz and 1 MHz.

Figure 10:
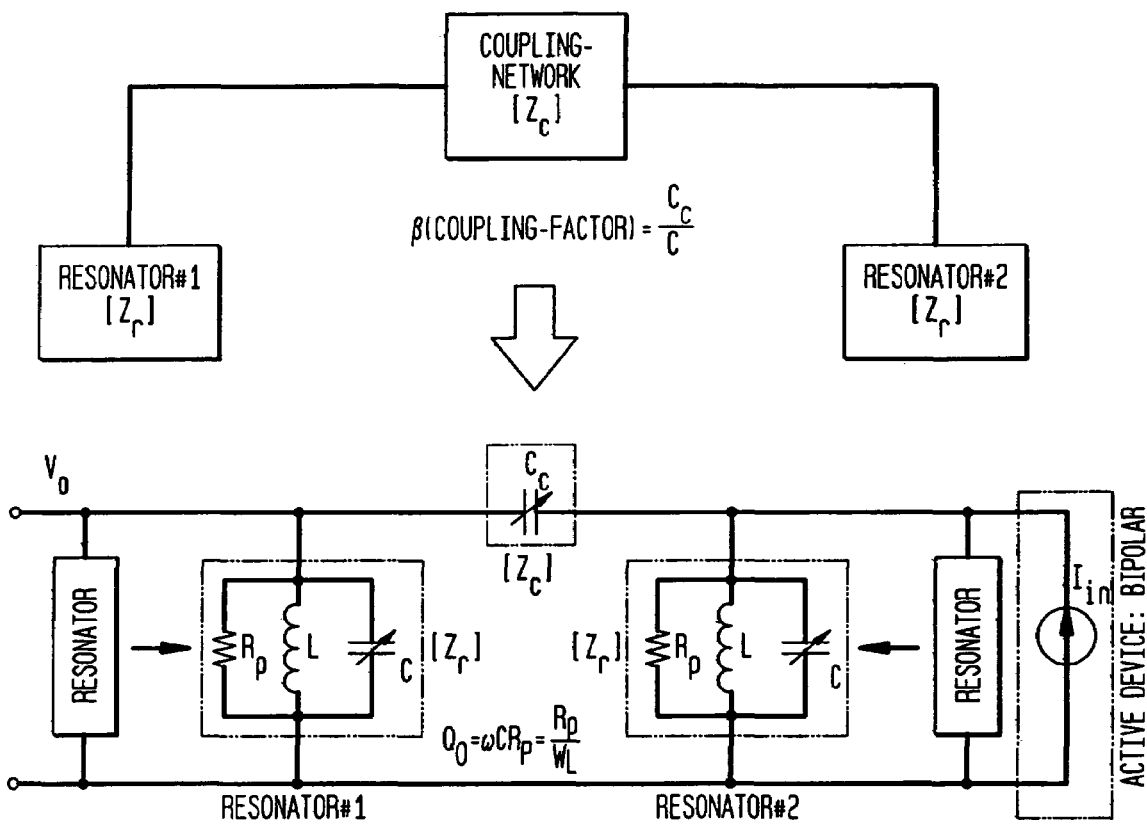
FIG. 10 is a representation of a capacitively coupled resonator oscillator.

As generally discussed above, the Q factor of a resonator network can be improved by introducing a coupling mechanism (inductive/capacitive/mode-coupling). For example, FIG. 10 illustrates a typical capacitive coupling mechanism between two substantially identical resonators (do not use EM coupling). As shown in FIG. 10, the resonators can be represented by equivalent parallel RLC network, where Zr and Zc are the resonators and the coupling network impedance, respectively The coupling factor β of the coupled resonator network (FIG. 10) can be defined as the ratio of the series coupling capacitor (Cc) to the resonator capacitor (C). The effective impedance Zeff is defined by:

$$Z_{eff}(\omega) = \left[\frac{V_o}{I_{in}}\right] = \frac{Z_r(\omega)}{2 + \frac{Z_c(\omega)}{Z_r(\omega)}} = \frac{Z_r^2(\omega)}{Z_c(\omega) + 2Z_r(\omega)} \quad (1)$$

$$Y_{eff}(\omega) = \frac{1}{Z_{eff}(\omega)} = \left[\frac{Z_c(\omega)}{Z_r^2(\omega)} + \frac{2}{Z_r(\omega)}\right] = \left[\frac{Y_r^2(\omega)}{Y_c(\omega)} + 2Y_r(\omega)\right] \quad (2)$$

where $I_{in}$ is a large signal current from the active device (Bipolar/FET). For $Z_c(\omega) \gg Z_r(\omega)$, and assuming the Q factor of $Z_r(\omega)$ is sufficiently large, the denominator of (1) can be considered as uniform over the frequencies within the bandwidth of $Z_r(\omega)$. The coupling admittance is defined by $Y_c(\omega) = j\omega C_c$. The resonator admittance is given by:

$$Y_r(\omega) = \left[\frac{1}{R_p} + \frac{1}{j\omega L} + j\omega C\right] = \left[\frac{j\omega L R_p}{R_p(1 - \omega^2 LC) + j\omega L}\right]^{-1} \quad (3)$$

$$Y_{eff}(\omega) = \left[\frac{2}{R_p} - \frac{2R_p(1 - \omega^2 LC)}{\omega^2 L R_p^2 \beta C}\right] +$$

$$j\left[\frac{\left[R_p^2(1 - \omega^2 LC)^2 - \omega^2 L^2\right]}{\omega^3 R_p^2 L^2 \beta C} - \frac{2R_p(1 - \omega^2 LC)}{R_p \omega L}\right] \quad (4)$$

From (4), the phase shift of the coupled resonator is given by:

$$\varphi = \tan^{-1}\left[\frac{\left(\frac{[R_p^2(1-\omega^2 LC)^2 - \omega^2 L^2]}{\omega^3 R_p^2 L^2 \beta C} - \frac{2R_p(1-\omega^2 LC)}{R_p \omega L}\right)}{\left(\frac{2}{R_p} - \frac{2R_p(1-\omega^2 LC)}{\omega^2 L R_p^2 \beta C}\right)}\right] \quad (5)$$

At resonance, the real part of the $Y_{\mathit{eff}}(\omega)$ is reduced to zero, and therefore, the resonance frequency can be described by $$\text{Re}[Y_{\mathit{eff}}(\omega)]_{\omega=\omega_0} = \quad (6)$$

$$\left[\frac{2}{R_p} - \frac{2R_p(1-\omega^2 LC)}{\omega^2 L R_p^2 \beta C}\right]_{\omega=\omega_0} = 0 \Rightarrow \omega_0^2 LC(1+\beta) = 1$$

$$[\omega_0]_{\phi=90^0} = \frac{1}{\sqrt{LC(1+\beta)}}; [Y_{\mathit{eff}}(\omega)]_{\omega=\omega_0} = -j\left[\frac{R_p^2\beta^2 C + (1+\beta)L}{\beta(1+\beta)\omega L R_p^2 C}\right] \quad (7)$$

$$Z_{\mathit{eff}}(\omega)]_{\omega=\omega_0} = \quad (8)$$

$$j\left[\frac{\beta(1+\beta)\omega L R_p^2 C}{R_p^2\beta^2 C + (1+\beta)L}\right] = j\left[\frac{\beta R_p^2 \omega C}{\frac{R_p^2\beta^2 C}{(1+\beta)L}+1}\right] \Rightarrow j\left[\frac{Q_0 \beta R_p}{1+Q^2\beta^2}\right]$$

where:

$$Q_0(\text{uncoupled}) = \omega C R_p = \frac{R_p}{\omega L}, \beta = \frac{C_c}{C}; 0 < \beta < 1$$

Figure 1:
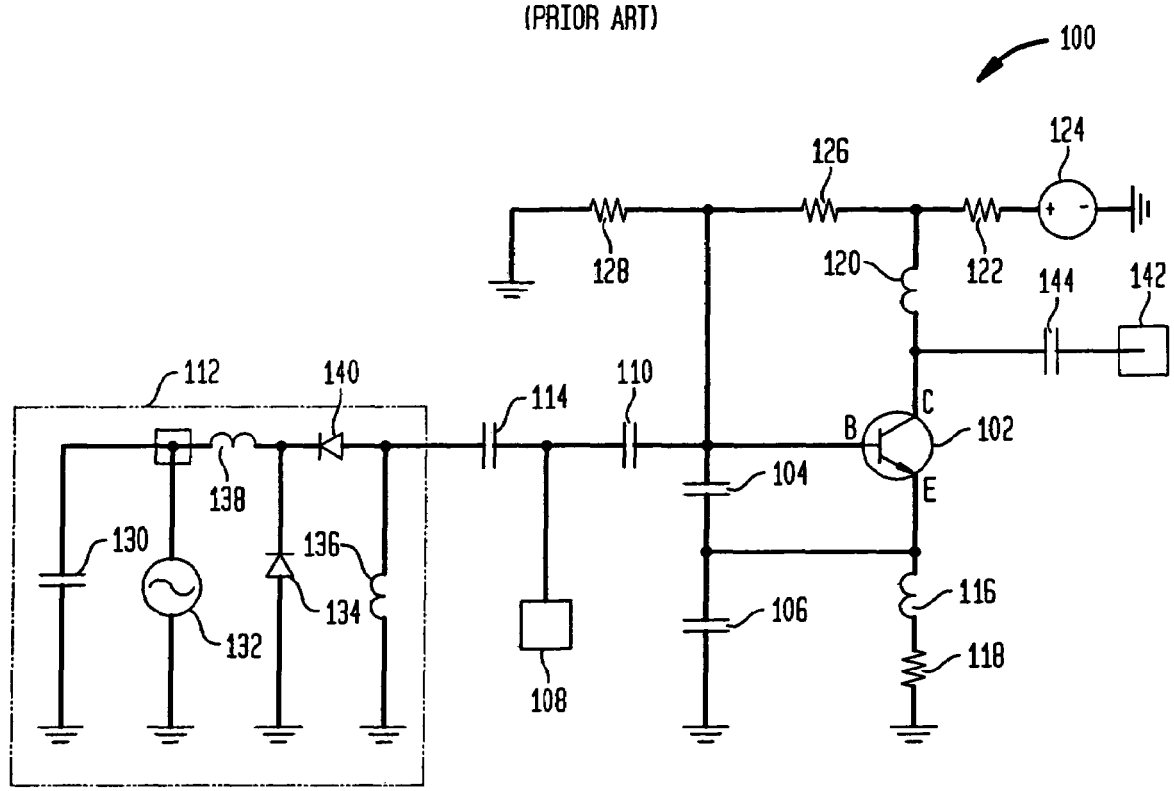
FIG. 1 is a schematic diagram of a prior art oscillator.

From (5), the quality factor of the capacitive coupled resonator network as shown in FIG. 1 is given by:

$$Q_L = [Q_{\mathit{coupled}}(\omega)]_{\omega=\omega_0} = \quad (9)$$

$$\frac{\omega_0}{2}\left[\frac{\partial\phi}{\partial\omega}\right] \cong \frac{2Q_0(1+\beta)}{(1+Q_0^2\beta^2)} \Rightarrow \left[\frac{2Q_0(1+\beta)}{(1+Q_0^2\beta^2)}\right]_{\beta<<1} \approx 2Q_0$$

From (8) and (9), for weak coupling ($\beta<<1$), attenuation can be high due a large value of $Z_c$. Therefore, there is trade-off between doubling the Q factor and the permissible attenuation required for the minimum phase noise performance.

For wideband tunability, the coupling factor $\beta$, can be dynamically adjusted over the tuning range by varying the coupling capacitor $C_c$ (as shown in FIG. 10) by using tuning diode for low noise performance over the tuning range.

From (9), loaded quality factor ($Q_L$) can be maximized by lowering the value of coupling capacitor $C_c$. Therefore, the upper limit of the loaded Q factor is dependent on the coupling factor $\beta$. Manufacturing a lower value coupling capacitor for high frequencies using integrated circuit technology is generally regarded as difficult.

Figure 11:
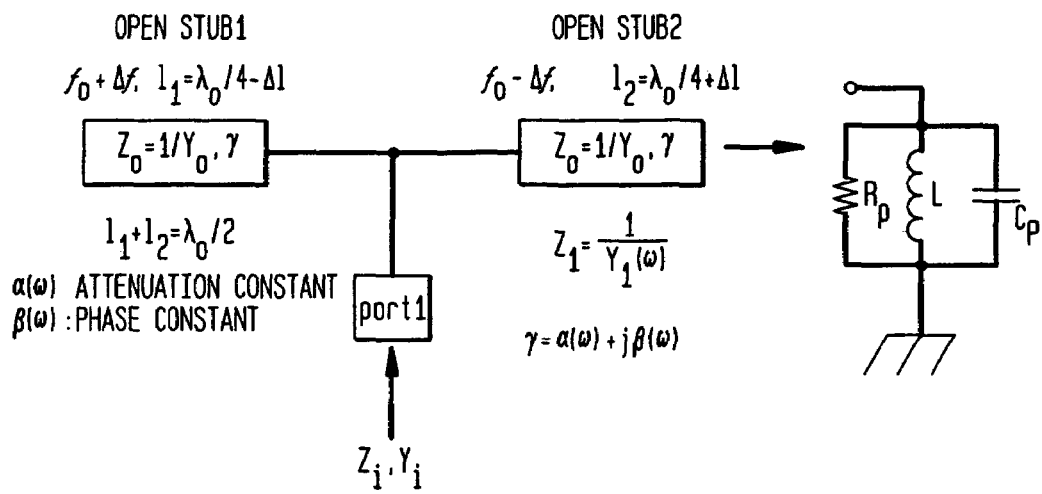
FIG. 11 is a representation of self-coupled, open-stubs resonators.

FIG. 11 shows typical self-coupled resonators. As shown, such resonators may comprise a parallel combination of two open-stubs having different lengths $l_1$ and $l_2$ ($l_{1,2}=\lambda_0/4\pm\Delta l$) respectively, where $\lambda_0$ is the wavelength at resonant frequency. The two unequal planar open-stubs exhibit resonant frequencies below and above $f_0$, in which length of the resonators are symmetrically offset by the amount $\pm\Delta l$ ($\Delta l<<\lambda_0$) for realization of the coupling mechanism without the insertion of lumped coupling element. The coupling factor $\beta$ can be controlled by varying the value of $\Delta l$ without using the lumped coupling element (capacitor/inductor), thereby optimizing the loaded quality factor of the coupled resonators.

The input admittance $Y_i(\omega)$ of the self-coupled planar stubs-tuned resonator (FIG. 11) can be described by:

$$Y_i(\omega) = G_i(\omega) + jB_i(\omega) \Rightarrow Z_i = \frac{1}{Y_i(\omega)} \quad (10)$$

$$Y_i(\omega) = Y_0\{\tanh[\gamma(\omega)l_1] + \tanh[\gamma(\omega)l_2]\} \quad (11)$$

$$Y_i(\omega) \cong \alpha(\omega)Y_0\left[\frac{l_1}{\cos^2(\omega l_1/v_p)} + \frac{l_2}{\cos^2(\omega l_2/v_p)}\right] + \quad (12)$$

$$jY_0\left[\tan\left(\frac{\omega l_1}{v_p}\right) + \tan\left(\frac{\omega l_2}{v_p}\right)\right]$$

$$G_i(\omega) \cong \frac{\alpha(\omega)}{Z_0}\left[\frac{l_1}{\cos^2(\omega l_1/v_p)} + \frac{l_2}{\cos^2(\omega l_2/v_p)}\right] \quad (13)$$

$$B_i(\omega) \cong \frac{1}{Z_0}\left[\tan\left(\frac{\omega l_1}{v_p}\right) + \tan\left(\frac{\omega l_2}{v_p}\right)\right] \quad (14)$$

$$\varphi = \tan^{-1}\left[\frac{B_i(\omega)}{G_i(\omega)}\right] = \tan^{-1}\left\{\frac{\left[\tan\left(\frac{\omega l_1}{v_p}\right) + \tan\left(\frac{\omega l_2}{v_p}\right)\right]}{\alpha(\omega)\left[\frac{l_1}{\cos^2(\omega l_1/v_p)} + \frac{l_2}{\cos^2(\omega l_2/v_p)}\right]}\right\} \quad (15)$$

where $Y_0$, $Z_0$, $v_p$, $\phi$, $\gamma(\omega)$, $G_i(\omega)$, and $B_i(\omega)$, are the characteristic admittance, characteristic impedance, phase velocity, phase shift, propagation constant, input conductance, input susceptance, respectively.

From (13), $R_p$ can be given by:

$$R_p(\omega_0) = \frac{1}{G_i(\omega_0)} \cong \frac{Z_0}{\alpha(\omega_0)}\left[\frac{l_1}{\cos^2(\omega_0 l_1/v_p)} + \frac{l_2}{\cos^2(\omega_0 l_2/v_p)}\right]^{-1} \quad (16)$$

From (12) and (14), $C_p$ and $L_p$ can be given by [FIG. 11]

$$C_p = \frac{1}{2}\left[\frac{\partial B_i(\omega)}{\partial \omega}\right]_{\omega=\omega_0} \quad (17)$$

$$C_p(\omega_0) = \frac{1}{2Z_0 v_p}\left[\frac{l_1}{\cos^2(\omega_0 l_1/v_p)} + \frac{l_2}{\cos^2(\omega_0 l_2/v_p)}\right], L_p(\omega_0) = \frac{1}{\omega_0^2 C_p} \quad (18)$$

From (16), (18), and (19), $\beta$ and Q factor can be described by $$\beta \cong \frac{\sin^2\left(\frac{2\pi}{\lambda_0}\Delta l\right)}{\alpha(\omega_0)[l_1+l_2]} = \frac{2\sin^2\left(\frac{2\pi}{\lambda_0}\Delta l\right)}{\alpha(\omega_0)\lambda_0} \quad (19)$$

$$Q_0 = \quad (20)$$

$$\frac{R_p}{\omega_0 L_p} = R_p \omega_0 C_p \Rightarrow Q_0 \cong \frac{\pi}{2\alpha(\omega_0)[l_1+l_2]} = \frac{\pi}{\alpha(\omega_0)\lambda_0} = \frac{\beta(\omega_0)}{2\alpha(\omega_0)}$$

$$Q_L = [Q_{\mathit{coupled}}(\omega)]_{\omega=\omega_0} = \quad (21)$$

$$\frac{\omega_0}{2}\left[\frac{\partial\phi}{\partial\omega}\right] \cong \frac{Q_0\alpha(\omega_0)[l_1+l_2]}{\left[\alpha(\omega_0)[l_1+l_2]+\sin^2\left(\frac{2\pi}{\lambda_0}\Delta l\right)\right]} \cong \frac{Q_0}{1+\beta}$$

From (16)-(19), it is seen that $R_p$, $C_p$, $L_p$, $\beta$, and $Q_L$ are dependent on the value of the offset length $\pm\Delta l$ of the open-stubs tuned resonators.

Figure 12:
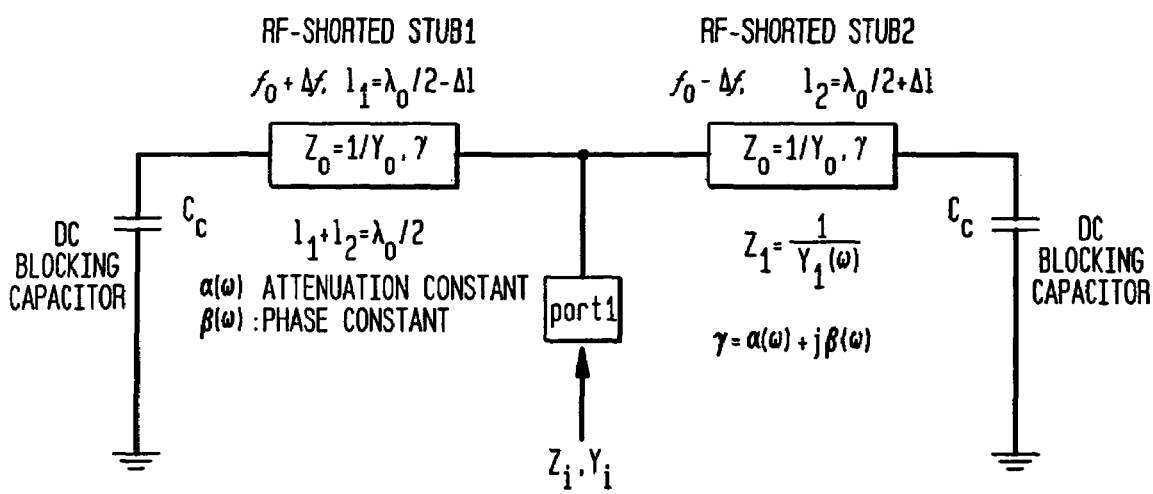
FIG. 12 is a representation of self-coupled, shorted-stubs resonators.

In addition to the open stubs self-coupled planar resonators discussed above, shorted stubs self-coupled resonators may also be used in accordance with an aspect of the present invention. FIG. 12 shows a parallel combination of two unequal shorted-stubs, having different lengths $l_1$ and $l_2$ ($l_1$, $_2=\lambda_0/2\pm\Delta l$) respectively, where $\lambda_0$ is a wavelength at a resonant frequency. The two unequal planar shorted-stubs exhibit resonant frequencies below and above $f_0$, in which length of the resonators are symmetrically offset by the amount $\pm\Delta l$ ($\Delta l<<\lambda_0$) for realization of a coupling mechanism without the insertion of lumped coupling element. As illustrated in FIG. 12, shorted-stubs may be terminated with DC blocking capacitors that can be removed when the resonator is not DC-biased. The resonant characteristic is basically similar to the open-stubs resonators ($l_{1,2}=\lambda_0/4\pm\Delta l$). The resonator parameters (unloaded Q: $Q_0$, loaded Q: $Q_L$, and coupling factor: $\beta$) of shorted-stubs ($l_{1,2}=\lambda_0/2\pm\Delta l$) can be given by:

$$Q_0 \cong \frac{\pi}{\alpha(\omega_0)\lambda_0} = \frac{\beta(\omega_0)}{2\alpha(\omega_0)}, \beta \cong \frac{\sin^2\left(\frac{2\pi}{\lambda_0}\Delta l\right)}{\alpha(\omega_0)[l_1+l_2]}, Q_L = \frac{Q_0}{1+\beta} \quad (22)$$

Figure 13:
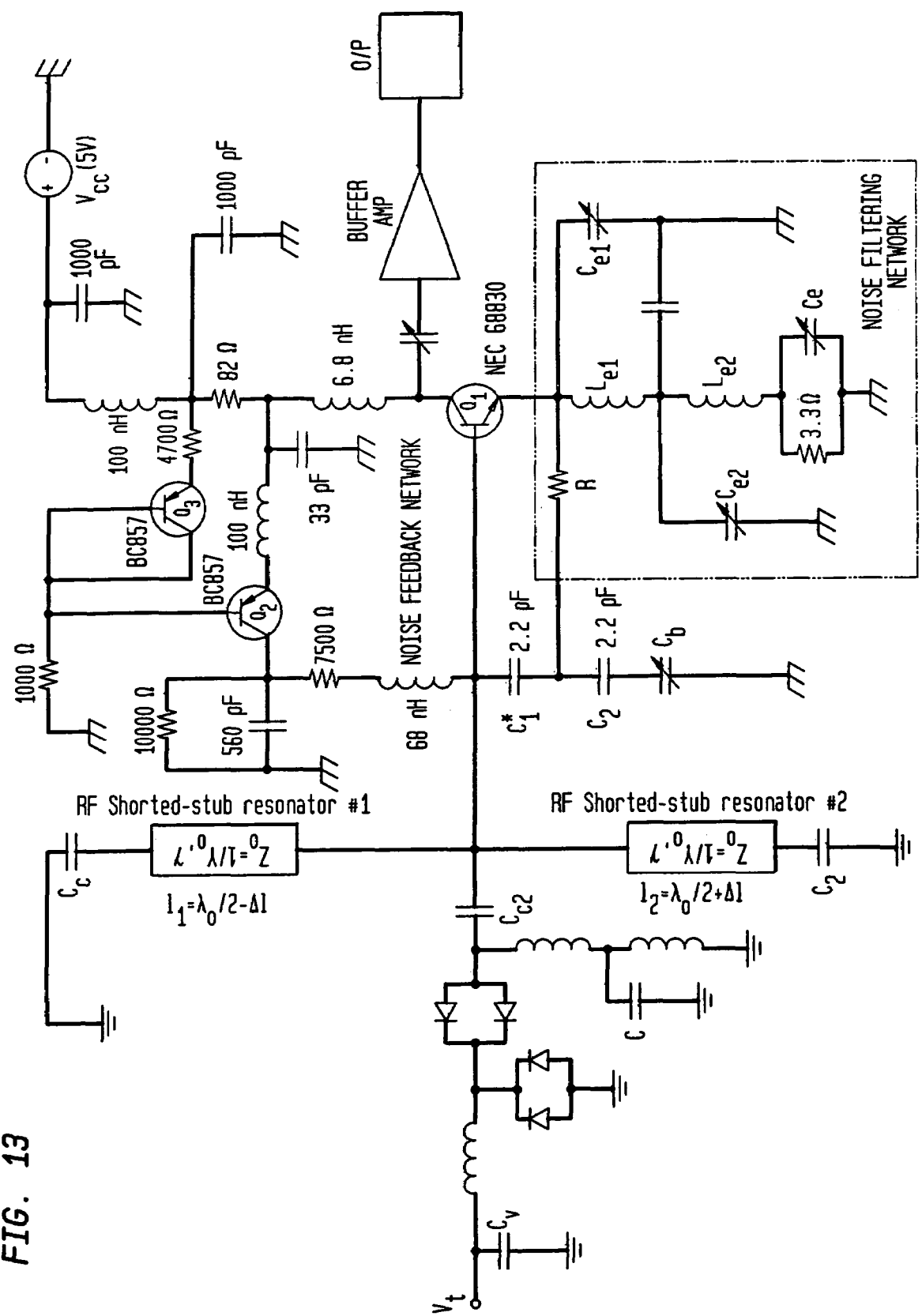
FIG. 13 is a schematic diagram of a self-coupled, shorted-stubs resonator oscillator.

FIG. 13 illustrates a circuit operating at 1000 MHz that comprises a coupled shorted-stub microstripline resonator oscillator in accordance with an aspect of the present invention.

Figure 14:
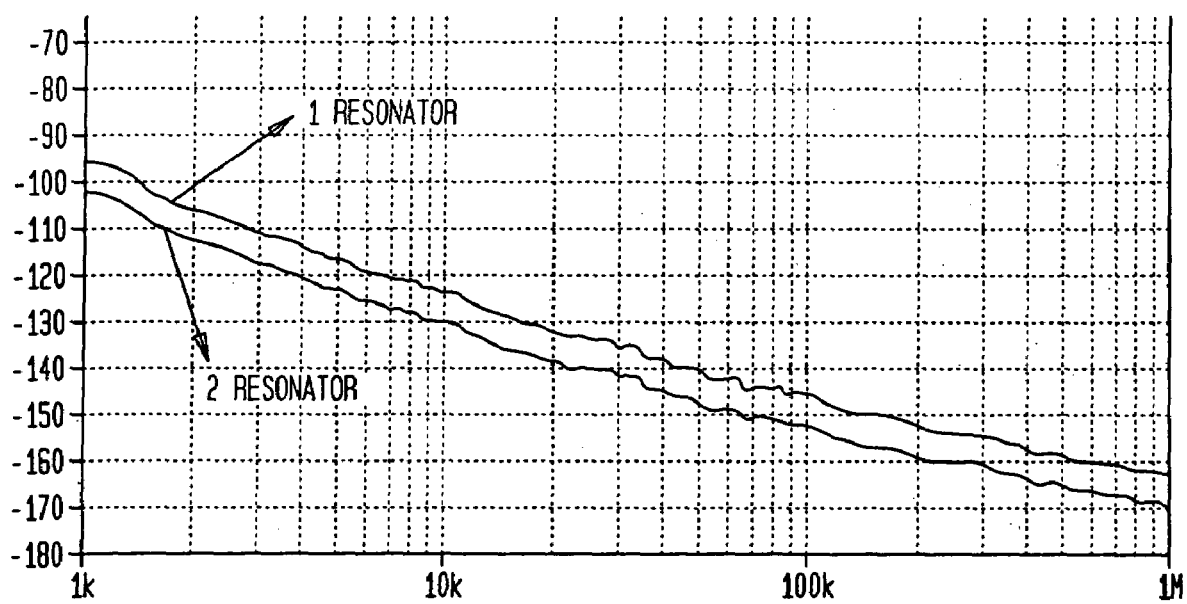
FIG. 14 is a plot of phase noise for a single-uncoupled shorted-stub resonator and a self-coupled shorted-stubs resonator oscillator.

FIG. 14 illustrates a phase noise plot for a single-uncoupled shorted-stub resonator (labeled "1") and a self-coupled shorted-stubs resonator (labeled "2"). As illustrated, the plot shows a reduction of approximately 8 dB in phase noise at 10 kHz offset in the self-coupled shorted-stubs resonator (labeled "2") as compared to the single uncoupled microstripline stub-tuned resonator (labeled "1"). Microstripline stub-tuned resonator based oscillator circuits typically exhibit a high degree of sensitivity to changes in the surrounding environment causing them to become microphonics, thereby, sensitive to phase hits. The capacitance between the planar microstripline section and the cover typically causes large cover frequency shift effects. In addition, the oscillator frequency is typically modulated by microscopic movements of the cover caused by noise and vibration, thereby creating microphonics effects that cause phase hits in the PLL circuits. One way of reducing those effects is to provide a planar multi-mode buried coupled stubs-tuned resonator in stripline domain (since they are self-shielding due to their dual ground plane architecture). FIGS. 6 and 7 show a schematic and layout of a 1000 MHz oscillator in a multilayer PCB (six-layers).

The oscillator circuit and layout in FIGS. 6 and 7 are insensitive to phase hits but typically have a limited tuning range. Moreover, the operating frequency is typically dependent upon the length of the shorted-stubs stripline resonator. The techniques and structures disclosed herein provide a user-defined frequency oscillator incorporating multiple shorting stubs ($S_1, S_2, S_3, S_4, S_5, S_6, S_7, S_8$) corresponding to hybrid modes (series and parallel resonance mode) for improved phase noise performances.

Figure 15:
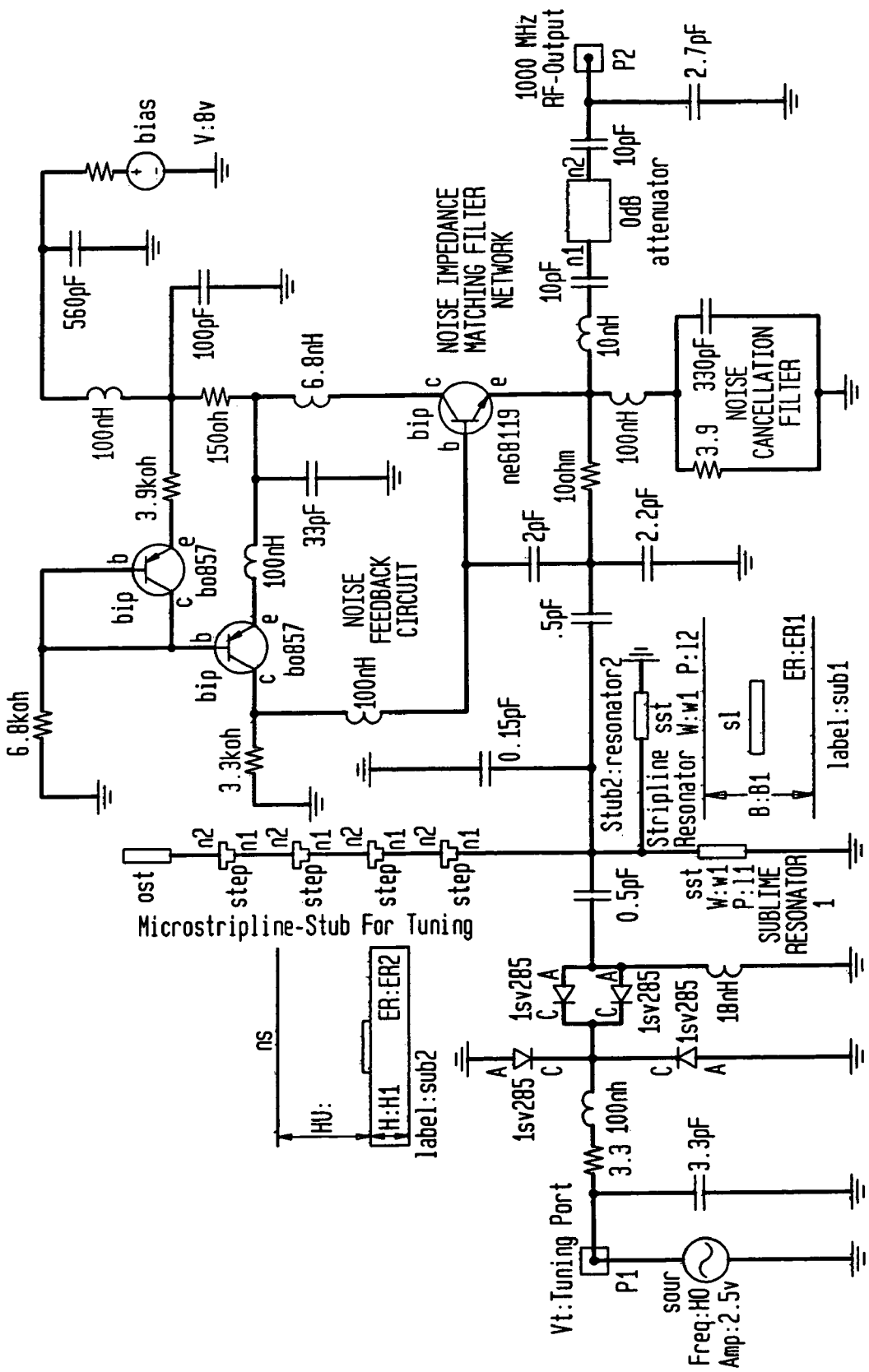
FIG. 15 is a schematic diagram of a shorted-stubs stripline resonator oscillator.

FIG. 15 is a schematic diagram of a self-coupled, shorted-stubs resonator oscillator.

Figure 16:
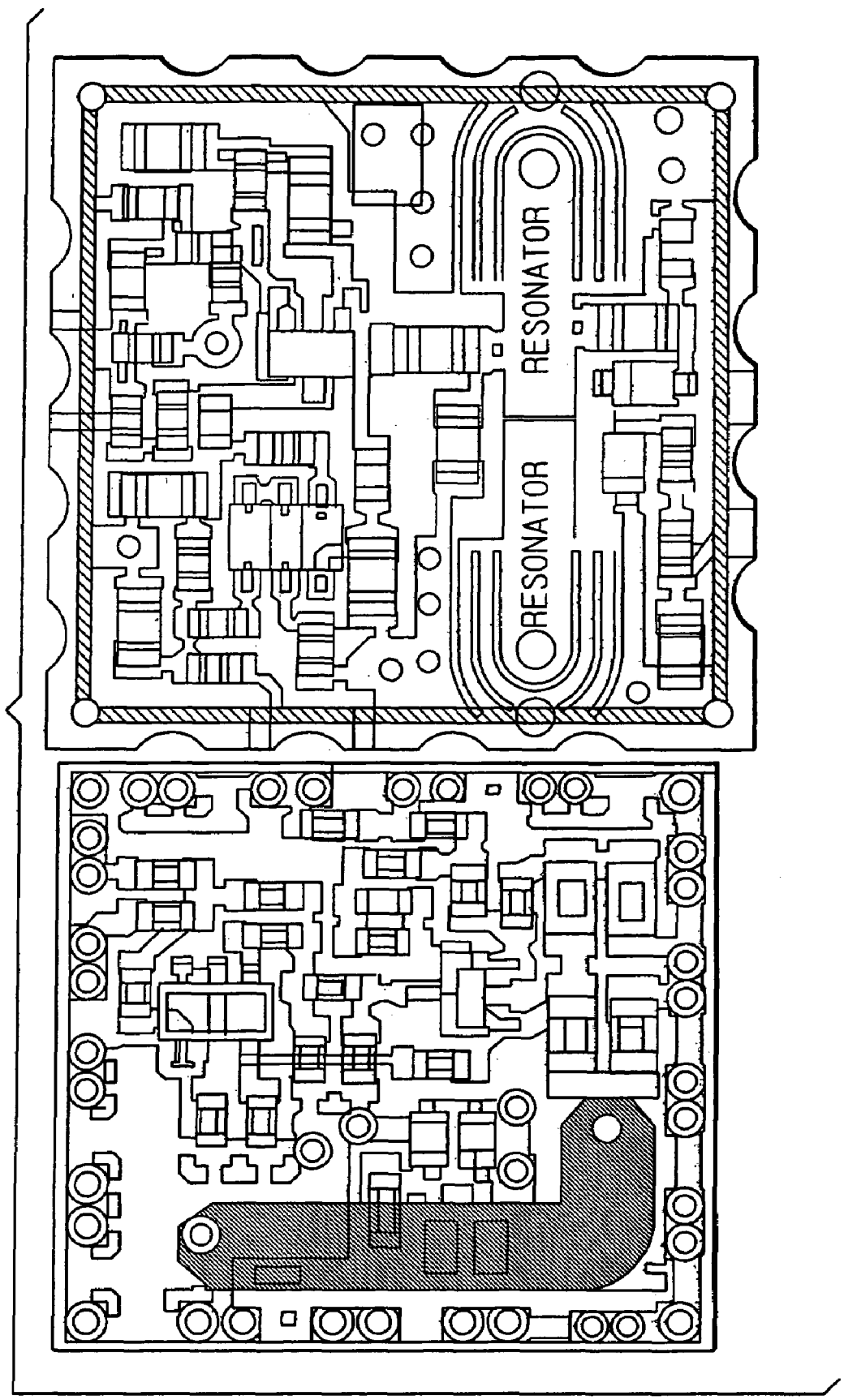
FIG. 16 is a layout of a user-defined hybrid-tuned oscillator.

FIG. 16 is a layout of a user-defined, hybrid-tuned oscillator.

Figure 17:
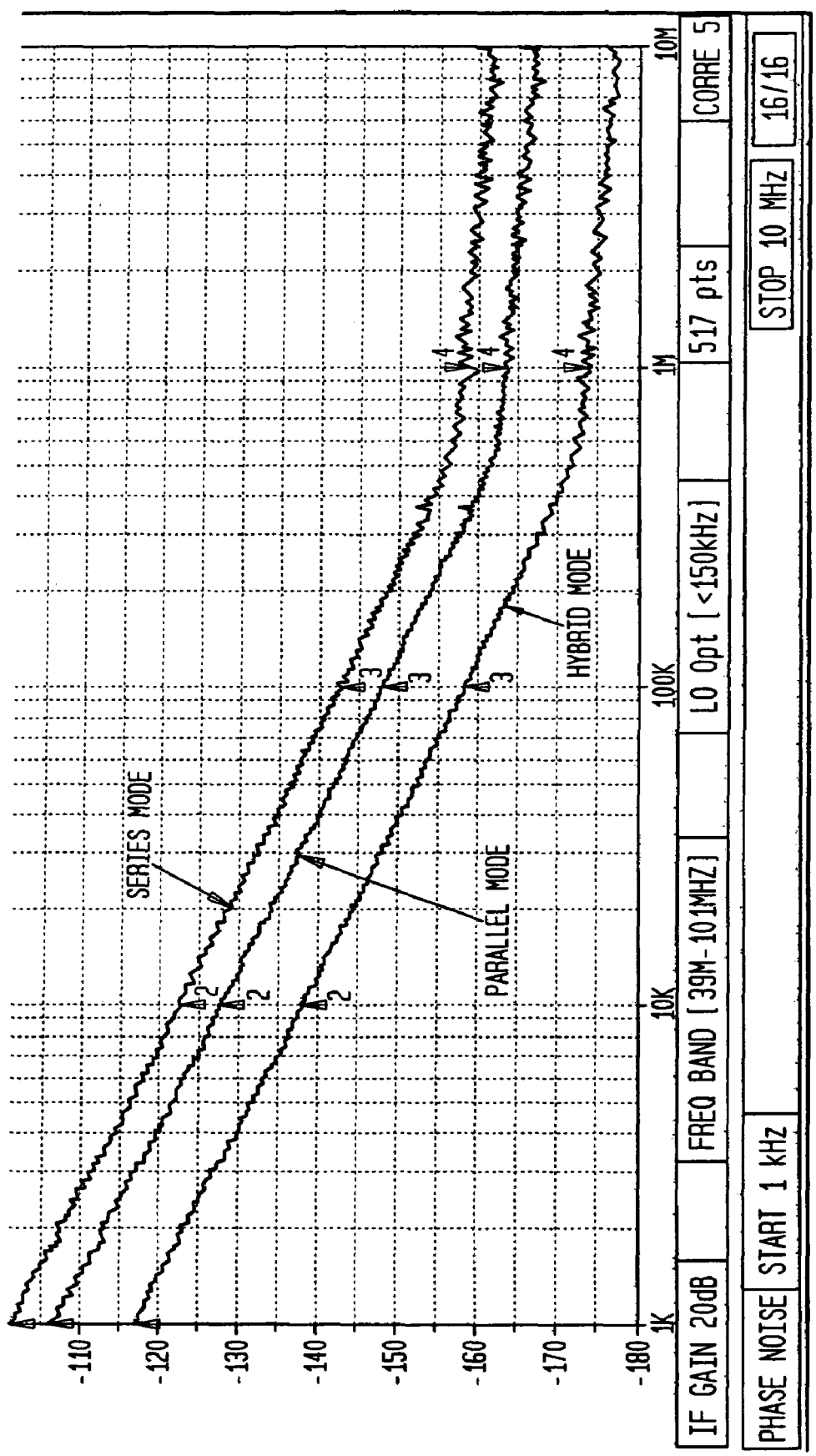
FIG. 17 is a plot of phase noise for a hybrid-tuned oscillator.

FIG. 17 shows a difference in phase noise for an oscillator according to the present invention as compared to phase noise for a typical 1 GHz (1000 MHz) oscillator for series, parallel, and hybrid resonance mode is −122 dBc/Hz, −126 dBc/Hz, and −135 dBc/Hz at 10 kHz offset from the carrier.

As previously discussed, SAW (surface acoustic wave) based oscillators are typically known for having relatively high quality factors (Q), and generally feature relatively low phase noise at fixed frequencies through about 3000 MHz. SAW resonators are, however, generally sensitive to microphonics. As already noted, microphonics are acoustic vibrations that traverse across an oscillator package and circuits and introduce noise and jitter leading to phase hits. In certain preferred embodiments, the present invention desirably overcomes problems associated with microphonics through a circuit or design topology that employs an optimum hybrid resonance mode in a distributed (microstrip line, stripline, suspended stripline) medium.

In addition, in accordance with an aspect of the present invention, phase hits may be reduced without appreciably sacrificing the phase noise and the tuning range performance. Circuits designed in accordance with the aspects of the present invention support fast convergence by dynamically tuning a distributed coupled resonator/inductor and the junction capacitances of the negative resistance-generating device (bipolar/FETs) for optimum noise performance over the tuning band. For example, introduction of a series tuned network in conjunction with noise cancellation network causes a change in the phase characteristics of the resonator network and dynamically modifies the noise transfer function of the parallel tuned oscillator circuit towards a large group delay and steeper phase slope, thereby increasing the effective loaded Q of the oscillator for a given conduction angle and drive level.

Microstrip oscillator circuits typically exhibit a high degree of sensitivity to changes in the surrounding environment causing them to become microphonic. Because of the problem with microphonics and other types of interference, stripline resonators are often used instead of microstrip resonators when designing oscillator circuits since they are self-shielding due to their dual ground plane architecture. The tradeoffs the designer faces when choosing a stripline rather than a microstrip are lower Q and higher capacitance. The lower Q and higher capacitance exhibited by the stripline causes the tuning range of the oscillator circuit incorporating the stripline to be reduced, as compared to when using a microstrip resonator. Another problem, which is encountered when designing oscillators using microstripline or stripline, is that they take up valuable space on the oscillator's circuit board.

Stripline and microstripline are increasingly being used in microwave circuits to provide well-characterized transmission line conductors that can be used to interconnect discrete circuit elements and to perform various impedance transformation functions. Both techniques, however, suffer from a variety of drawbacks. A microstripline is generally formed by a planar transmission line conductor spaced above a conducting ground plane. The impedance and velocity factor of the transmission line so formed is determined by factors such as the dielectric characteristics of the surrounding materials, the width of the planar conductor and its spacing from the ground plane. In free space, a microstrip works well. In actual application, however, its operation is sometimes impaired by stray coupling between the transmission line conductor and nearby objects. Fringe electromagnetic fields that extend above the conductor to foreign objects introduce irregularities into the impedance and velocity factor of the line, with a consequential undesirable effect on circuit performance.

In contrast to microstripline, a planar transmission line conductor, disposed between two ground planes, generally characterizes a stripline. Such construction offers a significant advantage over microstripline in that the problem of stray coupling to nearby objects is avoided. The second ground plane, which is omitted in microstripline construction, shields the transmission line conductor from the effects of nearby bodies and serves to confine the electromagnetic fields to the region between the ground planes. To construct an electronic circuit with stripline techniques, the desired transmission line conductors must first be sandwiched between two ground planes. Fabricating a custom laminated assembly normally achieves this. The components must then be connected to the various transmission line conductors. This step is complicated by the fact that the transmission line conductors are, by necessity, isolated between the two ground planes. While insulated conductors extending up or down through a ground plane can be employed to connect external components to the embedded transmission lines, the attendant circuit complexity is substantial. The manufacturing of a stripline circuit is thus significantly more difficult than that of a corresponding microstrip circuit.

In view of the practical difficulties associated with stripline, microstrip lines are used for the majority of microwave circuit applications. In some applications, however, even a small amount of stray coupling between a transmission line conductor and a foreign body, as might be expected to occur in any microstrip construction, can cause problems. Microstripline also suffers from dispersion of the electromagnetic waves propagating along the coupled transmission lines. The signal traveling down the planar microstrip conductor is accompanied by a surrounding electromagnetic field. On one side of conductor, this field travels in the dielectric region between the conductor and the ground plane. On the other side, however, this field travels in air. The velocities of these two waves are different; resulting in a dispersion of the incident signal into two phase-shifted signals by the time wave has traveled to the end of the conductor, thereby, variation in the group delay that leads to reduce the time average loaded Q.

In accordance with certain aspects of the present invention, a planar-coupled resonator in which a desirable resonant frequency can be adjusted with less deterioration in Q and which requires less in the way of production processing is provided. The resonator allows for multi-band frequency operation starting from 600 MHz to 5000 MHz. In the conventional microstripline/stripline resonator of VCOs, the resonant frequency is dependent on the length of the resonators and there will be degradation in the value of Q if the same resonant structure is used for other frequency band. In certain embodiments of the present invention, a planar coupled resonator in which the total dimensions of the resonator is unaltered and which at the same time exhibits multi-band resonance without degradation of the effective dynamic Q factor is provided. In addition, the number of manufacturing process steps is decreased and, therefore, a cost-effective manufacturing method for an integrated modern wireless communication system is provided.

With regard to conventional oscillators, noise is usually generated due to the low frequency modulation of the output signal arising from the non linear time variant (NLTV) transconductance ($g_m$), and junction capacitances ($C_{bc}$, $C_{be}$, and $C_{ce}$), of the negative resistance generating active device (bipolar/FETs). In some implementations of the present disclosure, the problem is addressed by dynamically minimizing the NLTV frequency modulation by optimizing noise impedance transfer function. Accordingly, the phase noise over the tuning range for different operating frequency bands may be reduced in accordance with the aspects of the present invention.

In certain aspects, the present invention reduces and/or nullifies the effects of non-linear variation of capacitance across the operating frequency band in a VCO, thereby reducing noise modulation in the VCO. Additionally, in some implementations, the effects of non-linear transistor capacitance may be substantially cancelled. Further in that regard, the present invention minimizes and compensates for the variation in the non-linear junction capacitance ($C_{bc}$, $C_{be}$, and $C_{ce}$) so that the same oscillator circuit can be used over several different frequency bands, such as those allocated for present and later generation wireless systems. This advantageously obviates the need to otherwise provide several SAW/Ceramic resonator based oscillators to meet the same requirement. This may be accomplished by adding a tunable capacitor across the junction capacitances of the transistor so that the influence of the junction capacitance ($C_{bc}$, $C_{be}$, and $C_{ce}$) can be reduced considerably due to change in the bias point, temperature, operating frequency, oscillator conduction angle, and drive level in a way to give optimum noise transfer function for the given resonance frequency. In accordance with the various aspects of the present invention, the active part includes linear capacitances that are connected in parallel with each non-linear junction capacitance ($C_{bc}$, $C_{be}$, and $C_{ce}$), which are integral parts of the active devices (i.e., transistors).

In order to achieve optimum results, the value of the linear capacitances should be greater than the effective values of the corresponding junction capacitance for a given drive level, operating frequency, conduction angle, and bias condition. As the effects of the non-linear components (junction capacitances) are reduced/eliminated from the VCO/transistor, the amount of phase noise in the oscillator output decreases. Thus, by reducing the effects of non-linear junction capacitance associated with transistors (bipolar/FETs), overall phase noise can be improved over the band. Moreover, by using linear capacitances the pushing effect and temperature stability of the VCO is improved because the capacitances across the transistor junctions reduce the effect of device capacitance changes with variation of supply voltage as well as variation of temperature.

As previously discussed, the present invention relates to an oscillator, and more particularly, to a low phase noise oscillator with planar coupled resonators. A resonator is an important element in many electrical systems and can be used to fabricate a filter or an oscillator. In manufacturing a resonator, many factors should be taken into consideration, such as size, cost, Q factor, and dependability. A popular resonator is formed by a plurality of capacitors and inductors. It has a low Q factor because of the power consumption of the capacitors and the inductors due to loss resonance associated with the reactive components. Another popular resonator is a coaxial resonator, which is large and expensive. A third popular resonator is a cavity resonator. It has a rectangular, cylindrical or spherical shape and is formed of conductive materials, and consequently has the characteristics of low power consumption and high Q factor, but large volume. A fourth resonator is a dielectric resonator, which is formed by a dielectric sphere. Although the dielectric resonator has a small volume, low power consumption, and high Q factor, manufacturing a dielectric resonator is still expensive. Another popular resonator is a planar resonator, e.g., a microstripline resonator, which is formed by disposing a conductive strip onto a circuit board. A conventional microstrip resonator has a low Q factor and consequently designing a low-phase-noise oscillator with such microstrip resonator is difficult. It is therefore a primary objective of the claimed invention to provide an oscillator with a high Q factor. Because one terminal of a microstrip resonator is open, microwave radiation will consume power so as to take the microstrip resonator have a low Q factor. Standard integrated circuits are planar circuits, so only those resonators having a planar structure, such as the microstrip resonator, are suitable for designing a microwave integrated circuit (MMIC) or radio frequency integrated circuit (RFIC).

In a prior art, only a single microstrip is used to serve as a resonance element in a resonator, so a Q factor of the resonator is low.

When an oscillator circuit generates a plurality of oscillating signals having different frequencies, only oscillating signals with the predetermined frequency will be output from the resonator by an electromagnetic coupling generated between the stripline. According to an aspect of the present invention, however, the electromagnetic coupling effect is generated between the microstrip and effectively increases the Q factor of the resonator. Furthermore, the oscillator can be installed on a multi-layer circuit board wherein the coupled lines are disposed on different layer of the board. The resonators are positioned parallel to each other, in such a way that adjacent resonators are coupled along the length equal to the guided quarter-wavelength of the centre frequency of the resonators. The present invention is directed generally to an apparatus and method for voltage controlled oscillation and, more particularly, to a multiple band voltage controlled oscillator using impedance scaling, and a method of providing multiple bands for a VCOs.

Extremely wideband VCOs are generally inherently sensitive to the control voltage noise, which again tightens the overall system noise requirements. In another aspect, the present invention comprises a series and parallel stubs controlling the resonance frequency and tuning range of the multiple coupled resonators network, but incorporated in the same VCO. The centre frequencies of the VCOs are chosen such that their operating intervals overlap. Another aspect of the present invention is to optimize the quality factor of the planar resonator by incorporating stubs. The resonator structure is fabricated in the middle layer of the PCB and its performance includes a Q factor (50-ohm load), which is more than 125 over the entire modern wireless frequency band (600-5000 MHz). These values are not usually met using conventional resonator topologies with the same or conventional planar resonator network. Those results typically provide more than 15-30 dB improvement in the noise performance compared to conventional VCO circuits and resonator structures.

A voltage-controlled oscillator implemented in accordance with the present invention may be employed in any number of devices that are used to communicate on data, telephone, cellular or, in general, communications network. Such devices may include but are not limited to, for example, cellular phones, personal digital assistants, modem cards, lap tops, satellite telephones. As a general matter, the oscillator circuitry shown in the various drawings and described above may be employed in a PLL to either generate a clock signal that may be used to transmit or recover information transmitted or received over a network. In addition to wireless networks, the circuitry of the present invention may be employed in wired networks, satellite networks, etc.

Other implementations are within the scope of the following claims.

For example, active devices other than transistors can be used. In general, any active device that provides a 180° phase shift between at least two of its terminals may be employed. The specific arrangement of circuit elements can be varied in a number of ways and considerably. Furthermore, the specific layout of circuit elements can vary. Additionally, although the parallel configuration of three-terminal devices disclosed herein includes a pair of three-terminal devices, any number of three-terminal devices could be connected in parallel.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A tunable oscillator, comprising:
a first transistor;
a second transistor connected in parallel with the first transistor;
a noise feedback and bias network coupled to the first and second transistors;
a planar coupled resonator network coupled to the transistors; and
means for dynamically tuning the resonant frequency of the planar coupled network and junction capacitance of the first and second transistors;
wherein the means for dynamically tuning comprises a plurality of capacitive elements coupled across each junction of the first and second transistors.

2. The tunable oscillator of claim 1 wherein each of the plurality of capacitive elements has a capacitance that is larger than the internal capacitance from the associated transistor junctions.

3. The tunable oscillator of claim 1 wherein the plurality of capacitive elements comprises:
a first capacitor;
a tuning diode in series with the first capacitor; and
a second capacitor in series with the tuning diode.

4. The tunable oscillator of claim 1 wherein the planar coupled resonator network comprises a plurality of stubs.

5. The tunable oscillator of claim 1 wherein the first and second transistors are bipolar junction transistors having respective base, collector and emitter terminals, wherein the base terminal of the first transistor is coupled to the base terminal of the second transistor, the collector terminal of the first transistor is coupled to the collector terminal of the second transistor, and the emitter terminal of the first transistor is coupled to the emitter terminal of the second transistor.

6. The tunable oscillator of claim 5 further comprising a resistor between the collector of the first transistor and the collector of the second transistor.

7. The tunable oscillator of claim 5 further comprising a resistor between the base of the first transistor and the base of the second transistor.

8. The tunable oscillator of claim 5 wherein the planar coupled resonator network is coupled to the base terminals of the first and second transistors.

9. The tunable oscillator of claim 5 wherein the noise feedback and bias network is coupled across the collector and base terminals of the first and second transistors.

10. The tunable oscillator of claim 1 wherein the noise feedback and bias network comprises:
a voltage source; and
a pair of transistors coupled to the voltage source,
wherein the noise feedback and bias network is adapted to bias the first and second transistors.

11. The tunable oscillator of claim 1 further comprising a buffer amplifier coupled to an output of the first and second transistors.

12. A tunable oscillator, comprising:
a parallel configuration of three-terminal devices comprising:
a first transistor; and
a second transistor connected in parallel with the first transistor;

a noise feedback and bias network connected to the first and second transistors;

a planar coupled resonator network coupled to the first and second transistors;

a plurality of series circuits, each comprising a first capacitor, a tuning diode and a second capacitor, wherein each series circuit is connected across an associated one of the junctions of the parallel configuration of three-terminal devices.

13. The tunable oscillator of claim 12 wherein the planar coupled resonator network comprises a plurality of stubs.

14. The tunable oscillator of claim 12 wherein each of the plurality of series circuits has a capacitance that is larger than the internal capacitance from the associated junctions.

15. The tunable oscillator of claim 12 wherein the first and second transistors are bipolar junction transistors having respective base, collector and emitter terminals, wherein the base terminal of the first transistor is coupled to the base terminal of the second transistor, the collector terminal of the first transistor is coupled to the collector terminal of the second transistor, and the emitter terminal of the first transistor is coupled to the emitter terminal of the second transistor.

16. The tunable oscillator of claim 15 further comprising a resistor between the emitter of the first transistor and the emitter of the second transistor.

17. The tunable oscillator of claim 15 further comprising a resistor between the base of the first transistor and the base of the second transistor.

18. The tunable oscillator of claim 15 wherein the planar coupled resonator network is coupled to the base terminals of the first and second transistors.

19. The tunable oscillator of claim 15 wherein the noise feedback and bias network is coupled across the collector and base terminals of the first and second transistors.

20. The tunable oscillator of claim 12 wherein the noise feedback and bias network comprises:

a voltage source; and a pair of transistors coupled to the voltage source, wherein the noise feedback and bias network is adapted to bias the first and second transistors.

21. The tunable oscillator of claim 12 further comprising a buffer amplifier coupled to an output of the first and second transistors.

22. A communications device comprising:

a transceiver; and a tunable oscillator coupled to the transceiver, the tunable oscillator comprising:

a first transistor;

a second transistor connected in parallel with the first transistor;

a noise feedback and bias network connected to the first and second transistors;

a planar coupled resonator network coupled to the transistors; and means for dynamically tuning the resonant frequency of the planar coupled network and junction capacitance of the transistors;

wherein the means for dynamically tuning comprises a plurality of capacitive elements coupled across each junction of the first and second transistors.

23. The tunable oscillator of claim 22 wherein each of the plurality of capacitive elements has a capacitance that is larger than the internal capacitance from the associated transistor junctions.

24. The communications device of claim 22 wherein the plurality of capacitive elements comprises:

a first capacitor;

a tuning diode in series with the first capacitor; and a second capacitor in series with the tuning diode.

25. The communications device of claim 22 wherein the planar coupled resonator network comprises a plurality of stubs.

26. The communications device of claim 22 wherein the first and second transistors are bipolar junction transistors having respective base, collector and emitter terminals, wherein the base terminal of the first transistor is coupled to the base terminal of the second transistor, the collector terminal of the first transistor is coupled to the collector terminal of the second transistor, and the emitter terminal of the first transistor is coupled to the emitter terminal of the second transistor.

27. The communications device of claim 26 further comprising a resistor between the emitter of the first transistor and the emitter of the second transistor.

28. The communications device of claim 26 further comprising a resistor between the base of the first transistor and the base of the second transistor.

29. The communications device of claim 26 wherein the planar coupled resonator network is coupled to the base terminals of the first and second transistors.

30. The communications device of claim 26 wherein the noise feedback and bias network is coupled across the collector and base terminals of the first and second transistors.

31. The communications device of claim 22 wherein the noise feedback and bias network comprises:

a voltage source; and a pair of transistors coupled to the voltage source, wherein the noise feedback and bias network is adapted to bias the first and second transistors.

32. The tunable oscillator of claim 22 further comprising a buffer amplifier coupled to an output of the first and second transistors.

* * * * *